(12) United States Patent
Wu et al.

(10) Patent No.: US 11,164,870 B2
(45) Date of Patent: Nov. 2, 2021

(54) STACKED UPPER FIN AND LOWER FIN TRANSISTOR WITH SEPARATE GATE

(71) Applicant: INTERNATIONAL BUSINESS MACHINES CORPORATION, Armonk, NY (US)

(72) Inventors: Heng Wu, Guilderland, NY (US);
Ruilong Xie, Niskayuna, NY (US);
Chun Wing Yeung, Niskayuna, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 16/580,720

(22) Filed: Sep. 24, 2019

(65) Prior Publication Data

US 2021/0091079 A1    Mar. 25, 2021

(51) Int. Cl.
*H01L 27/092* (2006.01)
*H01L 21/02* (2006.01)
(Continued)

(52) U.S. Cl.
CPC .... *H01L 27/0924* (2013.01); *H01L 21/02532* (2013.01); *H01L 21/823821* (2013.01); *H01L 21/823828* (2013.01); *H01L 21/823864* (2013.01); *H01L 21/823871* (2013.01); *H01L 29/165* (2013.01); *H01L 29/66545* (2013.01);
(Continued)

(58) Field of Classification Search
CPC ............. H01L 27/0924; H01L 29/7855; H01L 29/165; H01L 29/66545; H01L 29/66795; H01L 29/6656; H01L 21/823828; H01L 21/823864; H01L 21/823821;
(Continued)

(56) References Cited

U.S. PATENT DOCUMENTS 9,455,199 B1 * 9/2016 Jacob ................. H01L 27/0924
10,090,204 B1 10/2018 Hui
(Continued)

FOREIGN PATENT DOCUMENTS

EP     2112687 A2    10/2009

OTHER PUBLICATIONS

Mell et al., "The NIST Definition of AC Cloud Computing", NatioAnal Institute of Standards and Technology, Special Publication 800-145, Sep. 2011, 7 pages.
(Continued)

*Primary Examiner* — Khiem D Nguyen
(74) *Attorney, Agent, or Firm* — L. Jeffrey Kelly

(57) ABSTRACT

Forming a first opening in a first double stacked fin and forming a second opening in a second double stacked fin, by removing a high silicon germanium layer, forming a low k spacer, removing a dummy gate, and removing portions of the low k spacer from an outer surface of the first double stacked fin, and an outer surface of the second double stacked fin. A structure including an upper fin of a double stacked fin separated from a lower fin of a double stacked fin by a low k spacer and by a p type field effect transistor work function metal layer (PFET WFM), where a horizontal lower surface of the upper fin is coplanar with a horizontal upper surface of the low k spacer and a horizontal lower surface of the low k spacer is coplanar with a horizontal upper surface of the PFET WFM.

6 Claims, 20 Drawing Sheets

Section A-A

(51) Int. Cl.
  *H01L 21/8238* (2006.01)
  *H01L 29/66* (2006.01)
  *H01L 29/78* (2006.01)
  *H01L 29/165* (2006.01)

(52) U.S. Cl.
  CPC .... *H01L 29/66795* (2013.01); *H01L 29/7855* (2013.01)

(58) Field of Classification Search
  CPC ....... H01L 21/02532; H01L 21/823807; H01L 21/02164; H01L 21/8238; H01L 29/4966
  See application file for complete search history.

(56) References Cited

U.S. PATENT DOCUMENTS

| | | | |
|---|---|---|---|
| 10,163,905 B2 | 12/2018 | Ching | |
| 10,297,513 B1* | 5/2019 | Yamashita | H01L 29/6656 |
| 2016/0329326 A1* | 11/2016 | Balakrishnan | H01L 27/0886 |
| 2017/0278842 A1* | 9/2017 | Song | H01L 21/823431 |
| 2017/0338334 A1* | 11/2017 | Cheng | H01L 21/26506 |
| 2018/0277540 A1* | 9/2018 | Jagannathan | H01L 21/28088 |
| 2018/0286764 A1* | 10/2018 | Rodder | H01L 21/823807 |
| 2018/0315854 A1 | 11/2018 | Liaw | |
| 2018/0323259 A1* | 11/2018 | Holland | H01L 29/6681 |
| 2020/0286788 A1* | 9/2020 | Xie | H01L 29/6656 |

OTHER PUBLICATIONS

Yu et al., "Statistical Optimization of FinFET Processor Architectures under PVT Variations Using Dual Device-Type Assignment", J. Emerg. Technol. Comput. Syst. 14, 1, Article 3, Sep. 2017, 25 pages.

\* cited by examiner

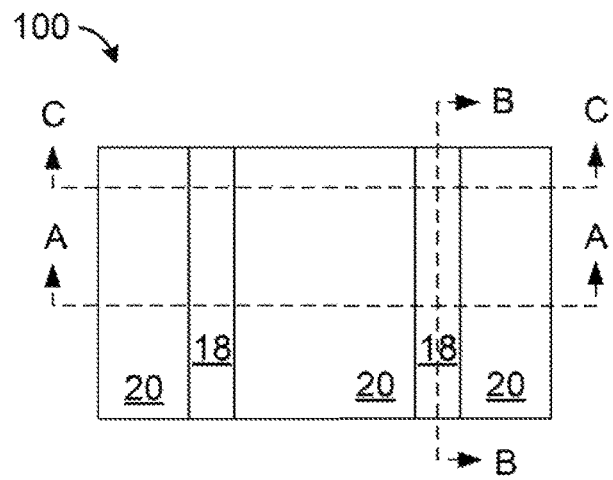
Figure 1
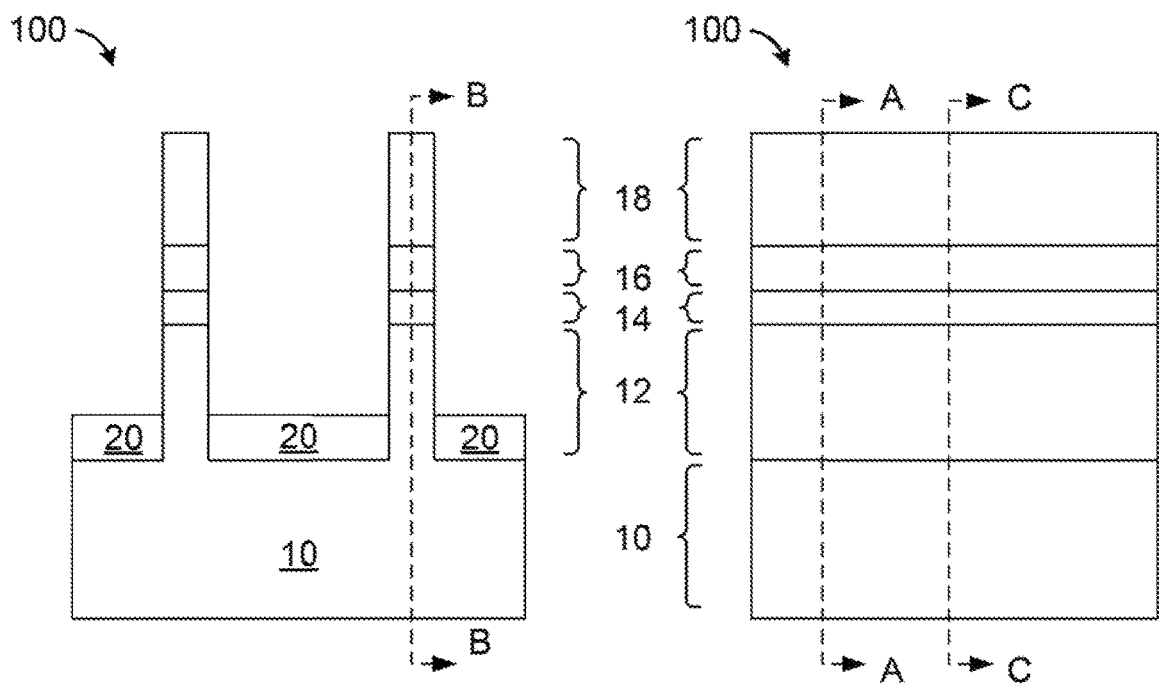
Figure 2
Section A-A
Section C-C
Figure 3
Section B-B Section C-C

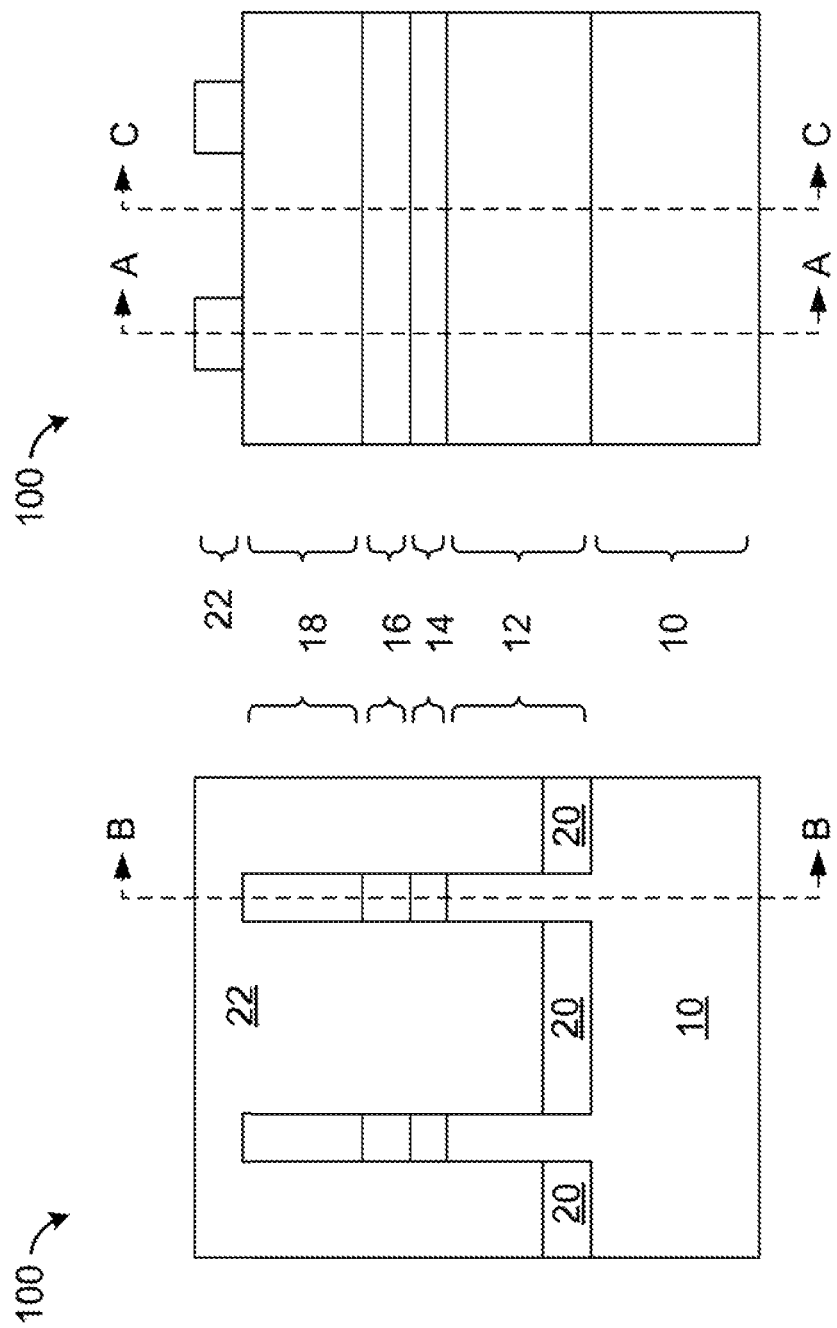

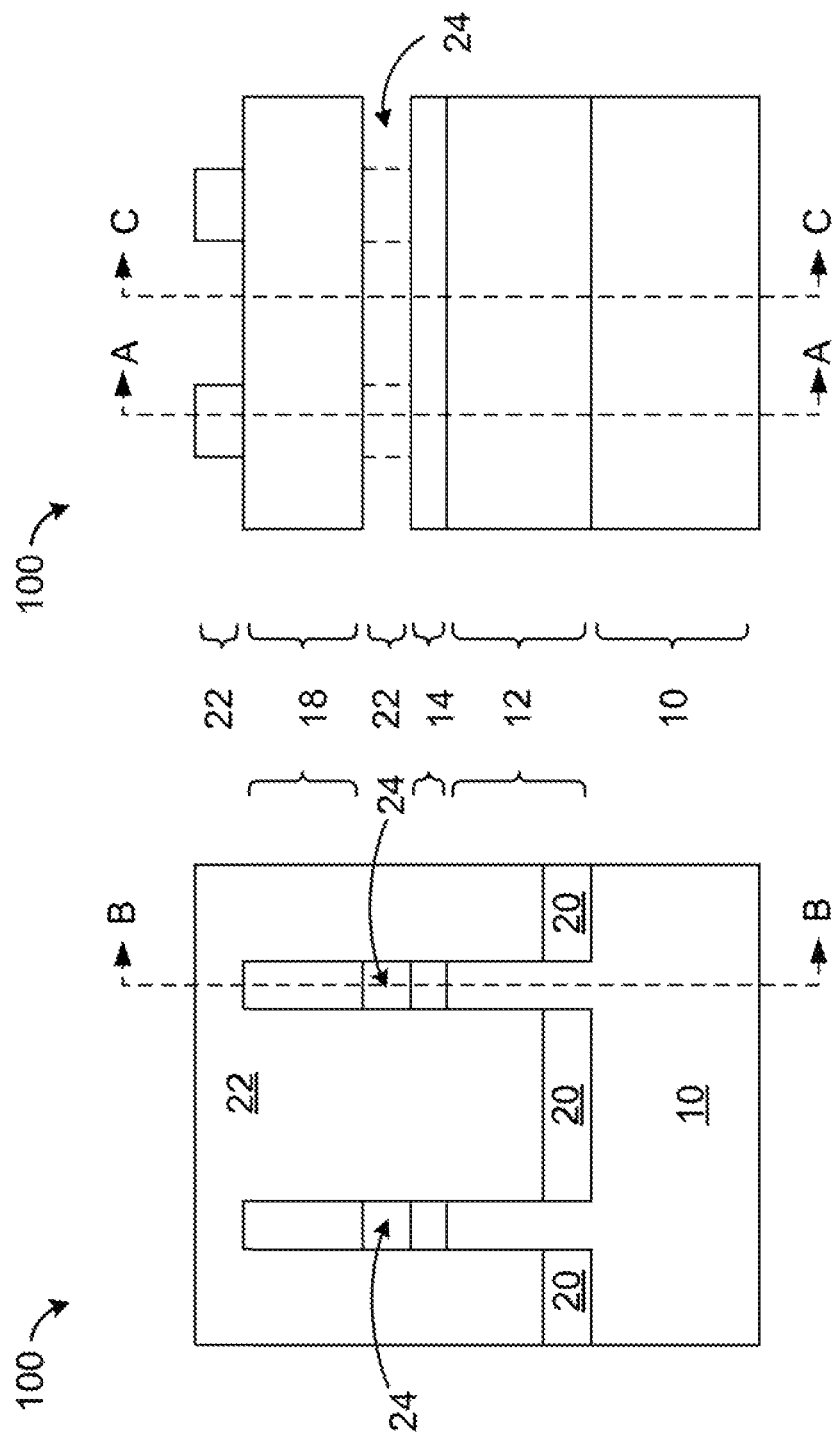

Section C-C

Section A-A

Section B-B

Section C-C

Section A-A
Section C-C

Section A-A

Section C-C

Section A-A

Section A-A**

Section A-A

Section A-A

Section A-A

Section A-A

Section A-A**

Section A-A

Section A-A

Section A-A

STACKED UPPER FIN AND LOWER FIN TRANSISTOR WITH SEPARATE GATE

BACKGROUND

The present invention relates, generally, to the field of semiconductor manufacturing, and more particularly to fabricating field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, stacked FETs help achieve a reduced FET device footprint while maintaining FET device performance. A vertical FET uses less surface area of a die than conventional FETs, and is needed with shrinking design rules.

A stacked FET or stacked FET is a structure in which a FET is vertically stacked above another FET along a fin, with a current flow in a horizontal direction, perpendicular to adjacent fins. A negative channel FET (hereinafter "NFET") may be stacked above a positive channel FET (hereinafter "PFET"). A common work function metal may be used for both the NFET and the PFET, providing a common gate used for both the NFET and the PFET. Using a common work function metal for both the NFET and the PFET is not suitable for voltage threshold balancing and for some circuit designs.

SUMMARY

According to an embodiment, a method for forming a semiconductor structure is provided. The method including forming a first opening in a first double stacked fin and forming a second opening in a second double stacked fin, where each the first and the second double stacked fin includes an upper silicon layer above a high silicon germanium layer, the high silicon germanium layer above a low silicon germanium layer, the low silicon germanium layer above a lower silicon layer formed from a substrate, by removing the high silicon germanium layer, forming a low k spacer on exposed surfaces of the semiconductor structure, where the low k spacer fills the first opening and the second opening, removing a dummy gate, where the dummy gate surrounds both the first and the second double stacked fin, and removing portions of the low k spacer from an outer surface of the first double stacked fin, an outer surface of the second double stacked fin, and a horizontal upper surface of the spacer.

According to an embodiment, a method for forming a semiconductor structure is provided. The method including forming a first opening in a first double stacked fin and forming a second opening in a second double stacked fin, where each the first and the second double stacked fin includes layers of an upper silicon layer above a high silicon germanium layer, which is above the low silicon germanium layer, which is above a lower silicon layer formed from a substrate, by removing the high silicon germanium layer, forming a low k spacer on exposed surfaces of the semiconductor structure, where the low k spacer fills the first opening and the second opening, removing a dummy gate, where the dummy gate surrounds both the first and the second double stacked fin, and removing portions of the low k spacer from an outer surface of the first double stacked fin, an outer surface of the second double stacked fin, and a horizontal upper surface of the spacer, forming a p-type field effect transistor work function metal layer on exposed surfaces of the semiconductor structure, where the p-type field effect transistor work function metal layer fills an opening between a horizontal lower surface of the low k spacer and a horizontal upper surface of the high k liner, forming an interlevel dielectric on exposed surfaces of the semiconductor structure, where a first horizontal upper surface of the interlevel dielectric between the first double stacked fin and the second double stacked fin, and a second horizontal upper surface of the interlevel dielectric includes a height greater than a height of an upper surface of the first and second double stacks fins, measured from a horizontal upper surface of the substrate, and removing an exposed portion of the p-type field effect transistor work function metal layer.

According to an embodiment, a structure for a semiconductor structure is provided. The structure including an upper fin of a double stacked fin separated from a lower fin of a double stacked fin by a low k spacer and by a p type field effect transistor work function metal layer, where a horizontal lower surface of the upper fin is coplanar with a horizontal upper surface of the low k spacer and a horizontal lower surface of the low k spacer is coplanar with a horizontal upper surface of the p type field effect transistor work function metal layer.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 1 illustrates a top view of a semiconductor structure at an intermediate stage of fabrication, according to an exemplary embodiment;

FIG. 2 illustrates a cross-sectional view of the semiconductor structure along sections A-A and C-C, according to an exemplary embodiment;

FIG. 3 illustrates a cross-sectional view of the semiconductor structure along section B-B according to an exemplary embodiment;

FIGS. 6 and 7 illustrate a cross-sectional view of the semiconductor structure along sections A-A and B-B and illustrates forming a dummy gate, according to an exemplary embodiment;

FIGS. 8, 9 and 10 illustrate a cross-sectional view of the semiconductor structure along sections A-A, B-B, and C-C, respectively, and illustrates removing a layer, according to an exemplary embodiment;

Figure 5:
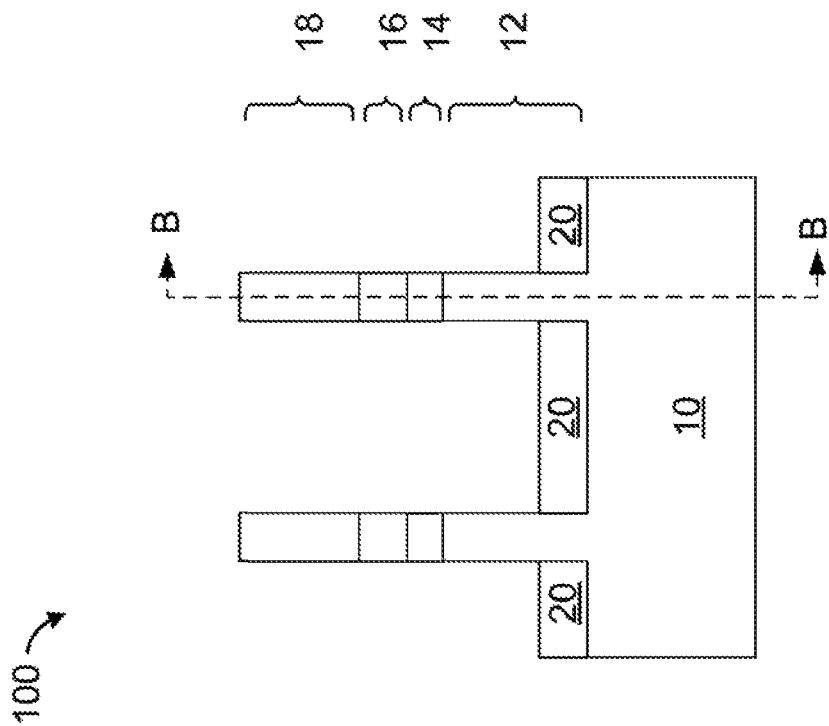
FIG. 5 illustrates a cross-sectional view of the semiconductor structure along section C-C, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Traditionally, in a stacked field effect transistor (hereinafter "FET"), a negative channel FET (hereinafter "NFET") is stacked above a positive channel FET (hereinafter "PFET"), and a common work function metal is used for both the NFET and the PFET in the double stack. This formation determines that both the NFET and the PFET share a gate due to the common work function metal. Using the same work function metal for a gate for both the NFET and the FET in the stacked FET is not suitable for voltage threshold balancing and is not suitable for some circuit designs. Using the same gate does not allow for separate control of a gate of either the NFET nor the PFET in the stacked FET. Other configurations of the double stacked FET may include two PFETs, two NFETs, or a PFET above an NFET. In all configurations, there are design advantages to having a separate gate for either FET in the double stack FET.

The present invention generally relates to semiconductor manufacturing and more particularly to fabricating a separate gate with a different work function metal for each an upper FET and a lower FET in a stacked FET formation.

A separate gate for the upper FET from a gate for the lower FET allows for a different voltage threshold for each.

In an embodiment of this invention, a threshold voltage of the upper FET can be matched to a threshold voltage of the lower FET by using different work function metals for the gate of each.

A middle dielectric isolation between the upper FET and the lower FET may be formed by using a sacrificial high silicon germanium layer on the fin between the upper FET and the lower FET, removing the sacrificial high silicon germanium layer and depositing a dielectric in place of the sacrificial high silicon germanium layer. A separate gate contact may be formed for each of the upper FET and the lower FET of the double stacked FET.

A method of forming a separate gate for each FET in a double stacked vertical FET is described in detail below by referring to the accompanying drawings in FIGS. 1-20, in accordance with an illustrative embodiment.

Referring now to FIGS. 1, 2 and 3, a semiconductor structure 100 (hereinafter "structure") is shown according to an exemplary embodiment. FIG. 1 is a top view of the structure 100. FIG. 2 is a cross-sectional view of the structure 100 along sections lines A-A and C-C, illustrating a cross-sectional edge of two fin structures. FIG. 3 is a cross-sectional view of the structure 100 along section line B-B, illustrating a cross-sectional side view of one of the fin structures, and is perpendicular to the section lines A-A and C-C. The structure 100 of FIGS. 1-3 may be formed or provided. During this stage of manufacture, the section lines A-A and C-C include a similar structure.

The structure 100 may include a substrate 10. The structure 100 may include a silicon layer 12, formed from the substrate 10, a low silicon germanium (hereinafter "low SiGe") layer 14 formed on the silicon layer 12, a high silicon germanium (hereinafter "high SiGe") layer 16 formed on the low SiGe layer 14, and an upper silicon layer 18 formed on the high SiGe layer 16. The silicon layer 12 may form a lower fin of a fin stack, and the upper silicon layer 18 may form an upper fin of the fin stack. There may be a spacer 20 on an upper surface of the substrate 10 between adjacent fin stacks, adjacent to a portion of a vertical side surface of the silicon layer 12.

The substrate 10 may be a bulk substrate, which may be made from any of several known semiconductor materials such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. Typically, the substrate 10 may be approximately, but is not limited to, several hundred microns thick.

In an embodiment, the low SiGe layer 14, the high SiGe layer 16 and the upper silicon layer 18 may be formed on the substrate 10, and subsequently double stacked fins formed. At this step of the manufacturing process, the beginning structure of a double stacked field effect transistor (hereinafter "FET") is shown. The double stacked FET may be formed on the substrate 10 according to techniques known in the art.

The low SiGe layer 14 may be formed on an exposed top surface of the substrate 10 by an epitaxial process and have a germanium context of approximately 20%. The high SiGe layer 16 have been formed by a subsequent epitaxial process on an exposed upper surface of the low SiGe layer 14 and have a germanium content of approximately 60%. The upper silicon layer 18 may be formed on an exposed upper surface of the low SiGe layer 14 by a further epitaxial process with silicon.

Examples of various epitaxial growth techniques used in forming each of the low SiGe layer 14. the high SiGe layer 16, and the upper silicon layer 18 may include, for example, rapid thermal chemical vapor deposition, low energy cluster beam deposition, ultra-high vacuum chemical vapor deposition, and atmospheric pressure chemical vapor deposition. The low SiGe layer 14, the high SiGe layer 16, and the upper silicon layer 18 may be doped during each epitaxy process (in-situ doping) or after the epitaxy process (ex-situ doping). A non-limiting list of exemplary epitaxial materials are: silicon germanium alloy (SiGe), silicon (Si), in-situ boron or gallium doped SiGe or Si, in situ phosphorus or arsenic doped Si or SiGe, with doping levels ranging from $1\times10^{19}/cm^3$ to $1.5\times10^{21}$ $cm^3$, with $4\times10^{20}$ $cm^3$ to $9\times10^{20}$ $cm^3$ dopant levels preferred.

A height of the double stacked fin measured from a horizontal upper surface of substrate 10, including a height of the silicon layer 12, a height of the low SiGe layer 14, a height of the high SiGe layer 16 and a height of the upper silicon layer 18 may be approximately 120 nm. A height of the silicon layer 12 measured from the horizontal upper surface of the substrate 10 to a horizontal lower surface of the low SiGe layer 14 may be approximately 40 nm. A height of the low SiGe layer 14 measured from a horizontal upper surface of the silicon layer 12 to a horizontal lower surface of the high SiGe layer 16 may be approximately 10 nm. A height of the high SiGe layer 16 measured from a horizontal upper surface of the low SiGe layer 14 to a horizontal lower surface of the upper silicon layer 18 may be approximately 10 nm. A height of the upper silicon layer 18 measured from a horizontal upper surface of the high SiGe layer 16 to a horizontal upper surface of the upper silicon layer 18 may be range from 40-60 nm. A vertical distance between adjacent double fin stacks may be 30 to 40 nm.

In general, a FinFET device may include a plurality of fins formed in the substrate 10. In this example, the double stacked FinFET may be formed from the substrate 10, the low SiGe layer 14, the high SiGe layer 16 and the upper silicon layer 18 using known photolithography and etch processes. It should also be noted, that in the context of FinFET devices the portion of the substrate 10 illustrated in the figures cross section A-A represents a cross-section view perpendicular with a length of the fins.

A FinFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of device spacers on opposite sides of the gate.

The spacer 20 may be formed after the formation of the double stacked finFETs. The spacer 20 may be formed by conformally depositing or growing a dielectric material, followed by a combination of dry and wet anisotropic etch and recessing steps to remove the dielectric material from the horizontal upper surface of the upper silicon layer 18 and from vertical side surfaces of the silicon layer 12, the low SiGe layer 14, the upper SiGe layer 16 and the upper silicon layer 18. After removal of portions of the dielectric material, the dielectric material may remain on an exposed upper surface of the substrate 10. The spacer 20 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the spacer 20 may include one or more layers. In an embodiment, the spacer 20 may include any dielectric material such as silicon oxide, silicon oxynitride, silicon nitride, SiBCN, SiOC, low-k dielectric or any combination of these materials. In an embodiment, the spacer 20 may be nitride. In an alternate embodiment, the spacer 20 may be oxide. In an embodiment, the spacer 20 may have a vertical thickness ranging from about 10 nm to about 20 nm above a horizontal upper surface of the substrate 10, and ranges there between, although a thickness less than 10 nm greater than 20 nm may be acceptable.

Figure 4:
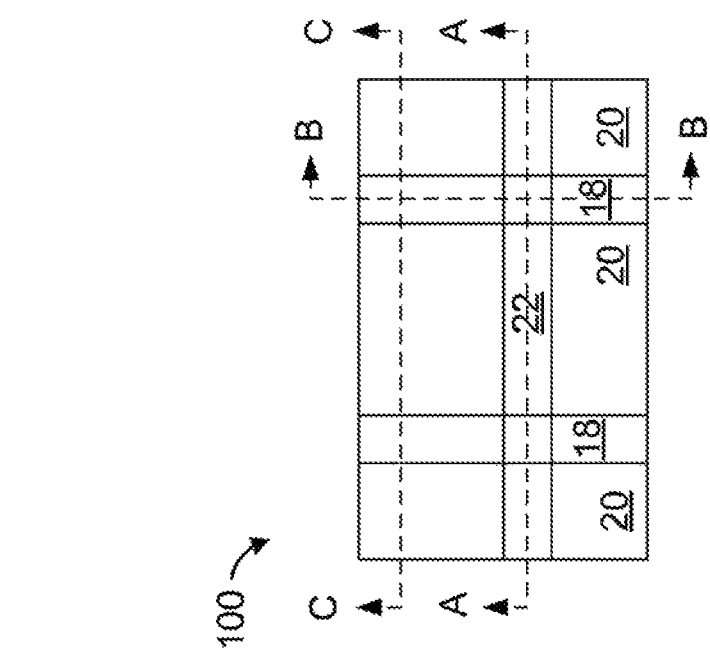
FIG. 4 illustrates a top view of the semiconductor structure, and illustrates forming a dummy gate, according to an exemplary embodiment.

Referring now to FIGS. 4, 5, 6 and 7, the structure 100 is shown according to an exemplary embodiment. FIG. 4 is a top view of the structure 100. FIGS. 5 and 6 are each a cross-sectional view of the structure 100 along section line C-C, and A-A, respectively, illustrating two cross-sectional edges of the two fin structures. FIG. 7 is a cross-sectional view of the structure 100 along section line B-B, illustrating a cross-sectional side view of one of the fin structures, and is perpendicular to the section lines A-A and C-C.

As shown in FIGS. 4, 6 and 7, a dummy gate 22 may be formed along section line A-A, according to an embodiment. As shown in FIG. 5, the dummy gate 22 may not be formed along section line C-C.

In a replacement gate (RG) fabrication approach, the structure 100 may be patterned and etched to form active device region (e.g., fins). Next, one or more dummy gates 22 may be formed in a direction perpendicular to the length of the fins. For example, the dummy gates may be pattered and etched from a polysilicon layer. A pair of sidewall spacers can be disposed on opposite sidewalls of the dummy gates. The dummy gates and the pair of sidewall spacers may then be surrounded by an inter-level dielectric. Later, the dummy gates may be removed from between the pair of device spacers. This creates an opening between the pair of device spacers where a metal gate, may then be formed between the pair of device spacers. Optionally, a gate dielectric may be configured below the metal gate.

Figure 10:
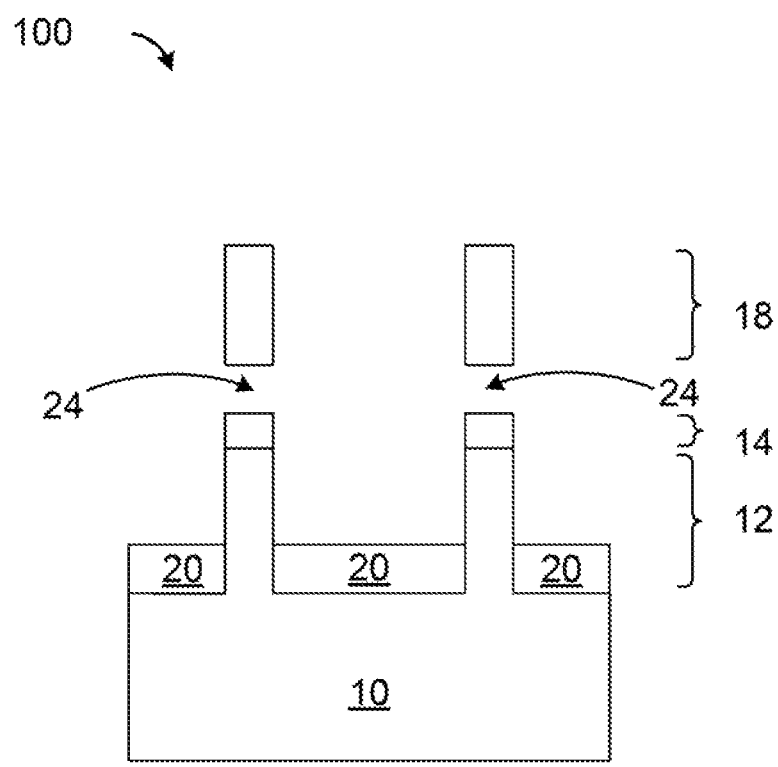

Referring now to FIGS. 8, 9 and 10, the structure 100 is shown according to an exemplary embodiment. FIGS. 8 and 10 are each a cross-sectional view of the structure 100 along section lines A-A and C-C, respectively, illustrating a cross-sectional edge of two fin structures. FIG. 9 is a cross-sectional view of the structure 100 along section line B-B, illustrating a cross-sectional side view of one of the fin structures, and is perpendicular to the section line A-A.

As shown in FIGS. 8, 9 and 10, the high SiGe layer 16 may be selectively removed. The dummy gate 22, which surrounds the fins in cross-sectional patterning lines may remain and provide support of the double stacked fin FET. The dummy gate 22 may remain above a portion of the horizontal upper surface and along a portion of a vertical side surface of the upper silicon layer 18. A gap 24 may be formed where the high SiGe layer 16 was removed. The dummy gate 22 may provide support for the upper silicon layer 18 above the gap 24, to retain a position of the upper silicon layer 18. The dummy gate 22 may provide support for the upper silicon layer 18 above the game 24 in an area surrounding the dummy gate 22, and also in an are further away from the dummy gate 22, as shown in FIG. 10.

The high SiGe layer 16 may be selectively removed using known techniques, using either a wet or dry etch process, with a selectively chemistry to remove the high SiGe layer 16. For example, the high SiGe layer 16 may be removed by a wet etching process or WETS. The wet etching processes may employ special chemical solutions including, for example, tetramethylammonium hydroxide (TMAH) solution, potassium hydroxide (KOH) solution, and ethylene diamine and pyrocatechol (EDP) solution. Alternatively, a wet etching processes that relies on a mixture solution of for example HF-HNO3-H2SO4, may be used. The material used for the wet etching process may be selective such the upper silicon layer 18, the low SiGe layer 14, the silicon layer 12 and the spacer 20 remain and are not etched. A horizontal lower surface of the upper silicon layer 18, the horizontal upper surface of the low SiGe layer 14 and the dummy gate 22 are not etched, while the high SiGe layer 16 is removed, such that the horizontal lower surface of the upper silicon layer 18, the horizontal upper surface of the low SiGe layer and a portion of an inner vertical side surface of the dummy gate 22 are exposed.

Figures 11, 12:
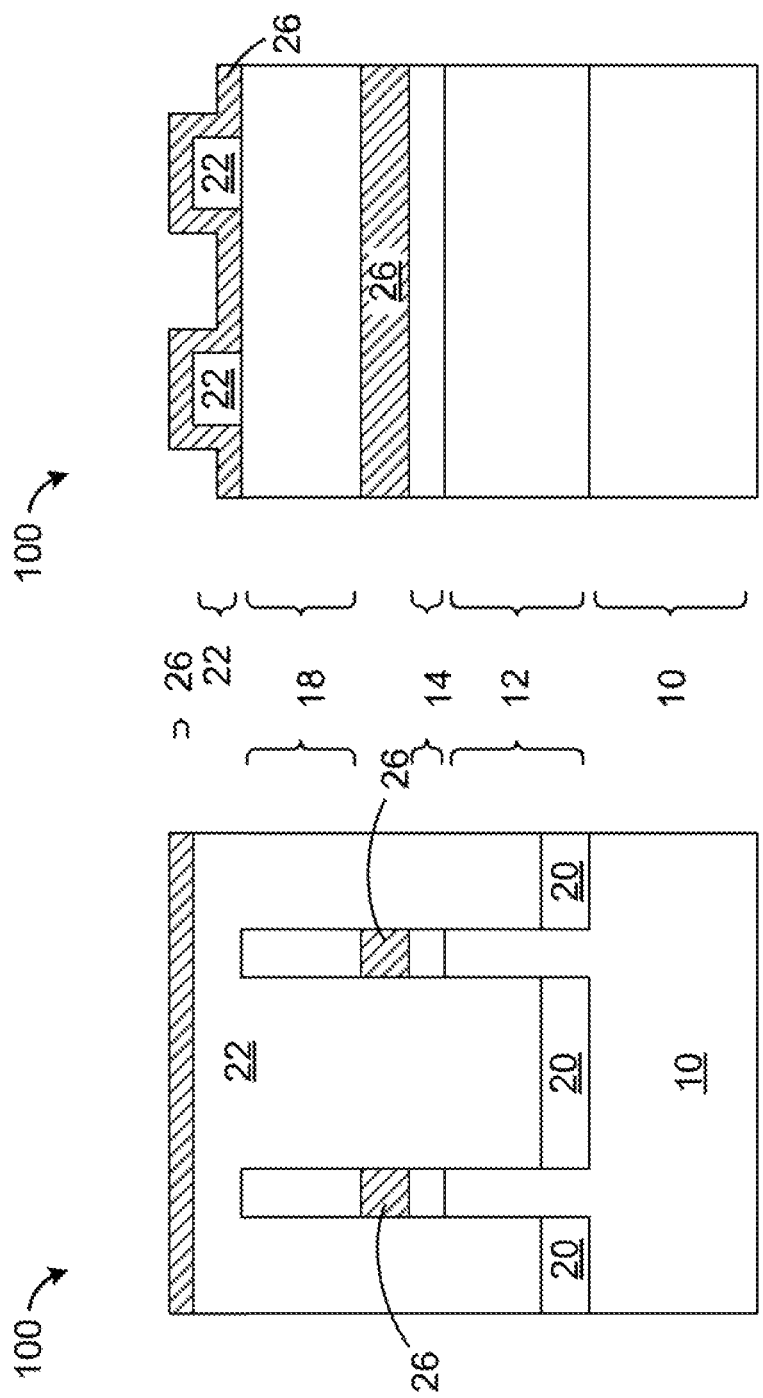
FIGS. 11, 12 and 13 illustrate a cross-sectional view of the semiconductor structure along sections A-A, B-B, and C-C, respectively, and illustrates forming a low k spacer, according to an exemplary embodiment.
Figure 13:
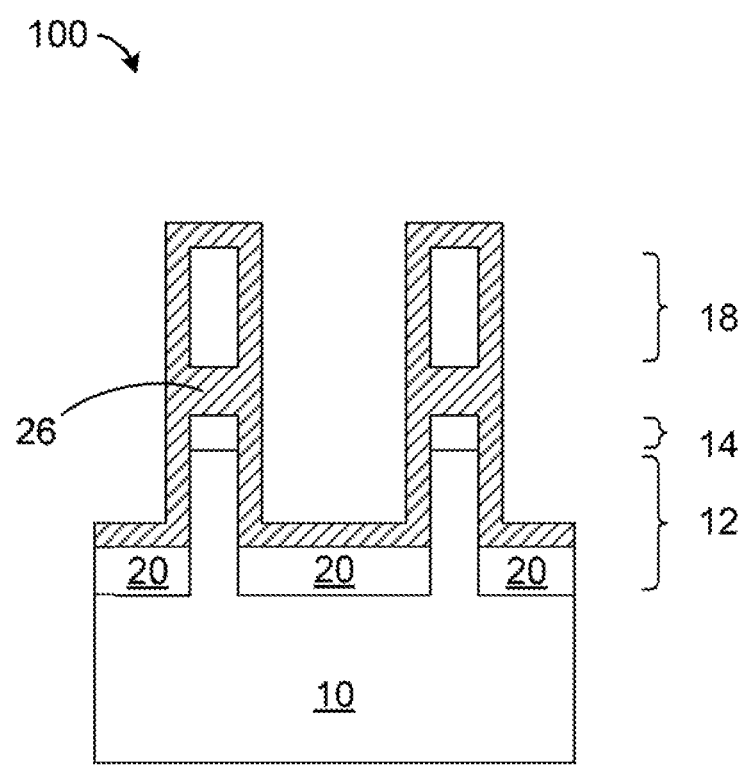

Referring now to FIGS. 11, 12 and 13, the structure 100 is shown according to an exemplary embodiment. FIGS. 11 and 13 are each a cross-sectional view of the structure 100 along section lines A-A and C-C, respectively, illustrating a cross-sectional edge of two fin structures. FIG. 12 is a cross-sectional view of the structure 100 along section line B-B, illustrating a cross-sectional side view of one of the fin structures, and is perpendicular to the section lines A-A and C-C.

As shown in FIGS. 11, 12 and 13, a low k spacer 26 may be conformally formed on exposed surfaces of the structure 100, and may be formed as described above in regards to the spacer 20.

The low k spacer 26 may completely fill the gap 24, where a horizontal lower surface of the low k spacer 26 is coplanar with the horizontal upper surface of the low SiGe layer 14, and a horizontal upper surface of the low k spacer 26 is coplanar with the horizontal lower surface of the upper silicon layer 18.

Along section line A-A, a vertical side surface of the low k spacer 26 is coplanar with the portion of the inner vertical side surface of the dummy gate 22, with the vertical side surface of the upper silicon layer 18, a vertical side surface of the low SiGe layer 14 and the vertical side surface of the silicon layer 12. A portion of a second horizontal lower surface of the low k spacer 26 is coplanar with a horizontal upper surface of the dummy gate 22, another portion of the second horizontal lower surface of the low k spacer 26 is coplanar with a portion of the horizontal upper surface of the upper silicon layer 18. A second vertical side surface of the low k spacer 26 is coplanar with another vertical side surface of the dummy gate 22.

Along section line C-C, a vertical side surface of the low k spacer 26 is coplanar with, with the vertical side surface of the upper silicon layer 18, a vertical side surface of the low SiGe layer 14 and the vertical side surface of the silicon layer 12. A portion of a second horizontal lower surface of the low k spacer 26 is coplanar with a horizontal upper surface of the upper silicon layer 18.

The low k spacer 26 may have a thickness of approximately 10 nm in the gap 24, completely filing the gap 24 between the low SiGe layer 14 and the upper silicon layer 18. The low k spacer 26 may have a thickness of 6 to 8 nm on an upper surface of the structure 100. The low k spacer 26 may be formed as described above in regards to the spacer 20.

Figure 14:
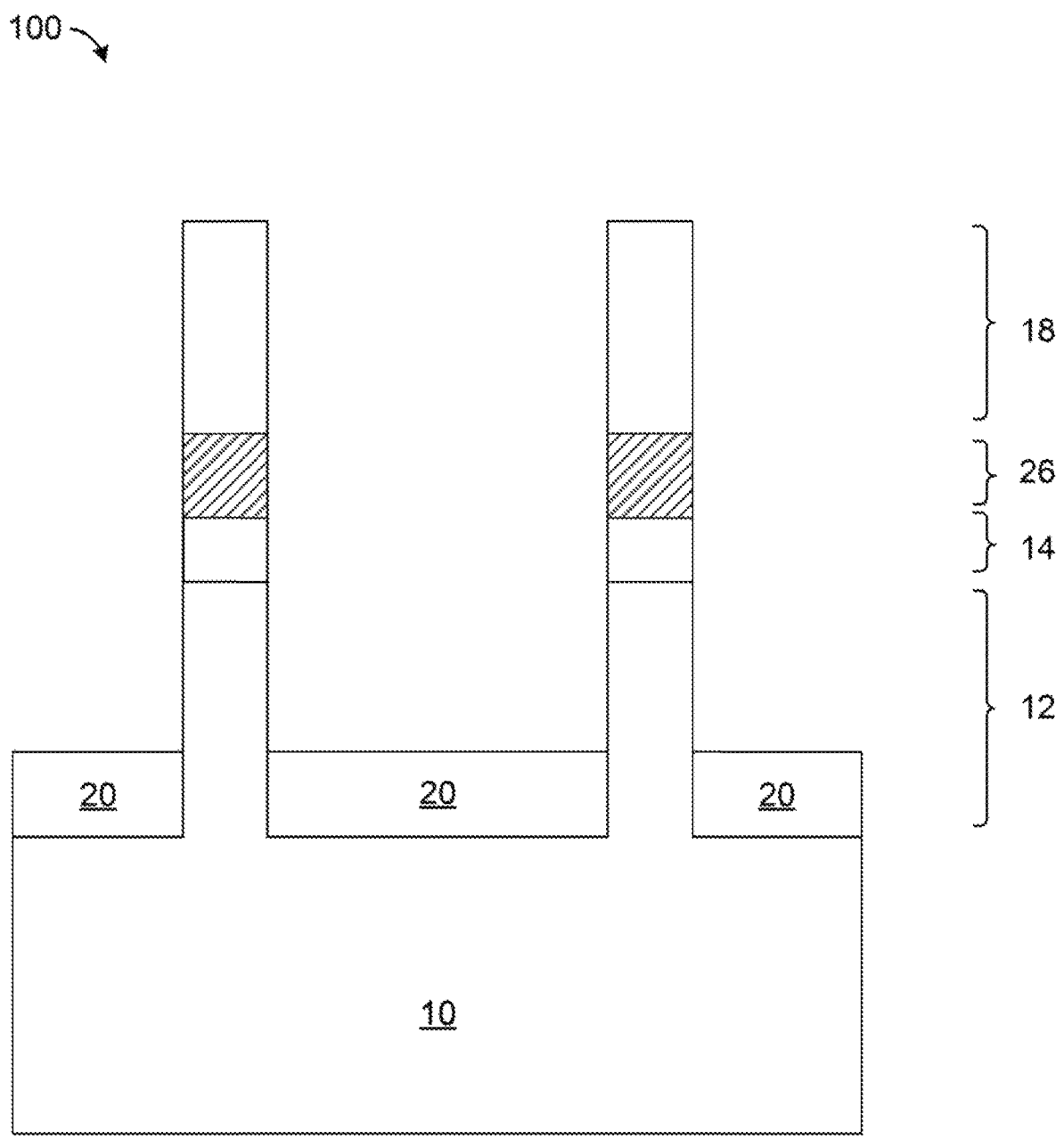
FIG. 14 illustrates a cross-sectional view of the semiconductor structure along sections A-A and C-C, respectively, and illustrates partial removal of the low k spacer, according to an exemplary embodiment.

Referring now to FIG. 14, the structure 100 is shown according to an exemplary embodiment. FIG. 14 is a cross-sectional view of the structure 100 along section lines A-A and C-C, illustrating a cross-sectional edge of two fin structures. At this point of manufacture, a similar structure is seen along section lines A-A and C-C.

As shown in FIG. 14, the dummy gate 22 and portions of the low k spacer 26 on upper surfaces of the structure 100 may be selectively removed from the structure 100, leaving the low k spacer 26 between the low SiGe layer 14 and the upper silicon layer 18. The dummy gate 22 and portions of the low k spacer 26 may be selectively removed using known techniques, using either a wet or dry etch process, with a selectively chemistry, as described above.

First, the low k spacer 26 may be removed from the horizontal upper surface and the vertical surface of the dummy gate 22 above the upper silicon layer 18, while remaining between the low SiGe layer 14 and the upper silicon layer 18. The low k spacer 26 may be removed from a horizontal surface upper and the vertical side surface of the upper silicon layer 18.

Subsequently, the dummy gate 22 may be removed from the horizontal upper surface of the upper silicon layer 18.

Alternatively, the selective removal of the low k spacer 26 and the dummy gate 22 may be performed simultaneously.

The remaining portion of the low k spacer 26 may completely fill the previous gap 24, where the horizontal lower surface of the low k spacer 26 is coplanar with the horizontal upper surface of the low SiGe layer 14, and the horizontal upper surface of the low k spacer 26 is coplanar with the horizontal lower surface of the upper silicon layer 18. The vertical side surface of the low k spacer 26 may be coplanar with the vertical side surface of the upper silicon layer 18, the vertical side surface of the low SiGe layer 14 and the vertical side surface of the silicon layer 12.

Subsequent to the removal of the portion of the low k spacer 26 and the dummy gate 22, epitaxy and shallow trench isolation regions (hereinafter "STI") may be patterned and formed selectively between fins, to create source/drain regions for the lower fin of the structure 100. The epitaxy and STI are not in the section A-A view of the structure 100.

Figure 15:
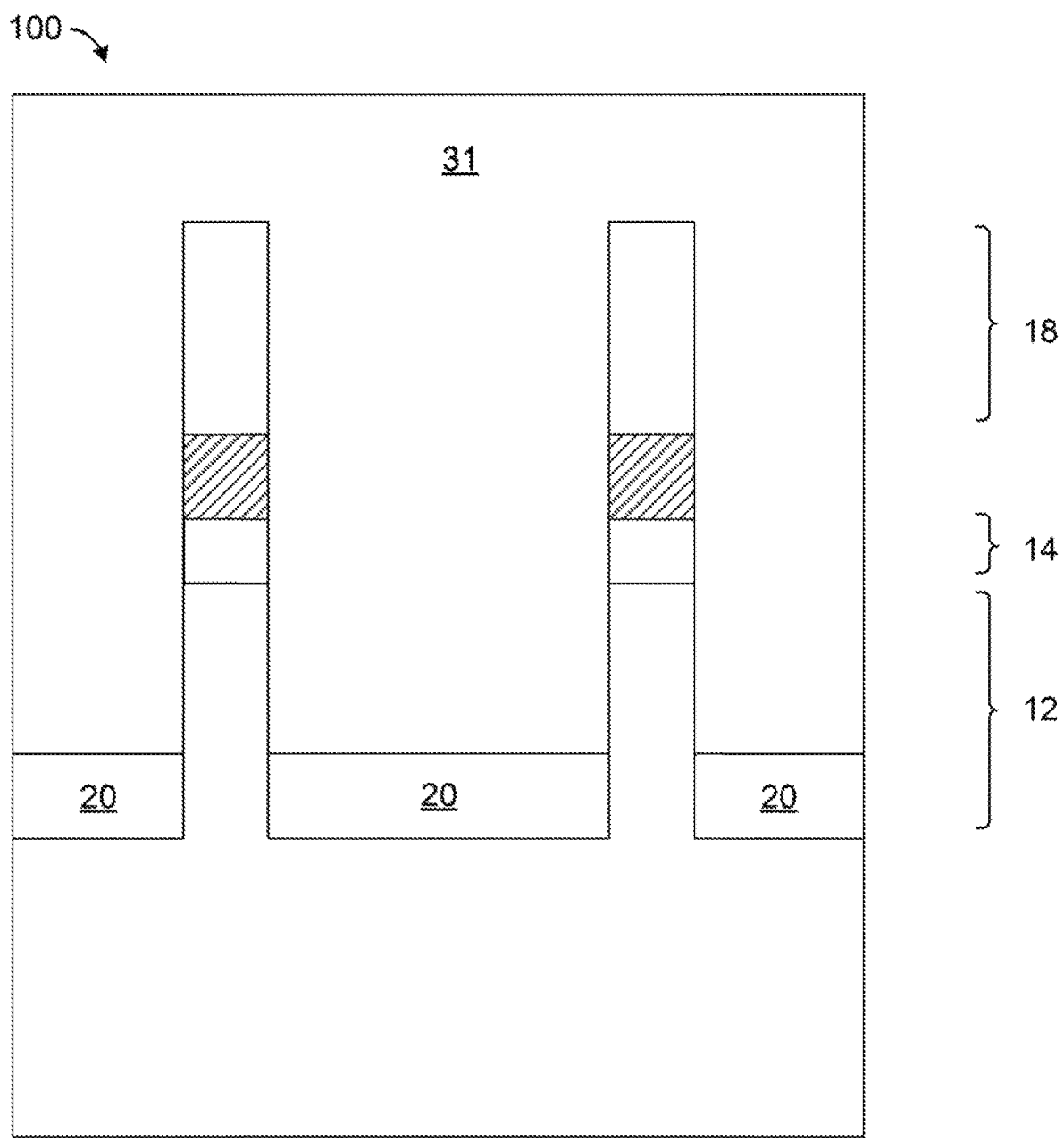
FIGS. 15 and 16 illustrate a cross-sectional view of the semiconductor structure along sections A-A and C-C, respectively, and illustrates formation of a source-drain, according to an exemplary embodiment.
Figure 16:
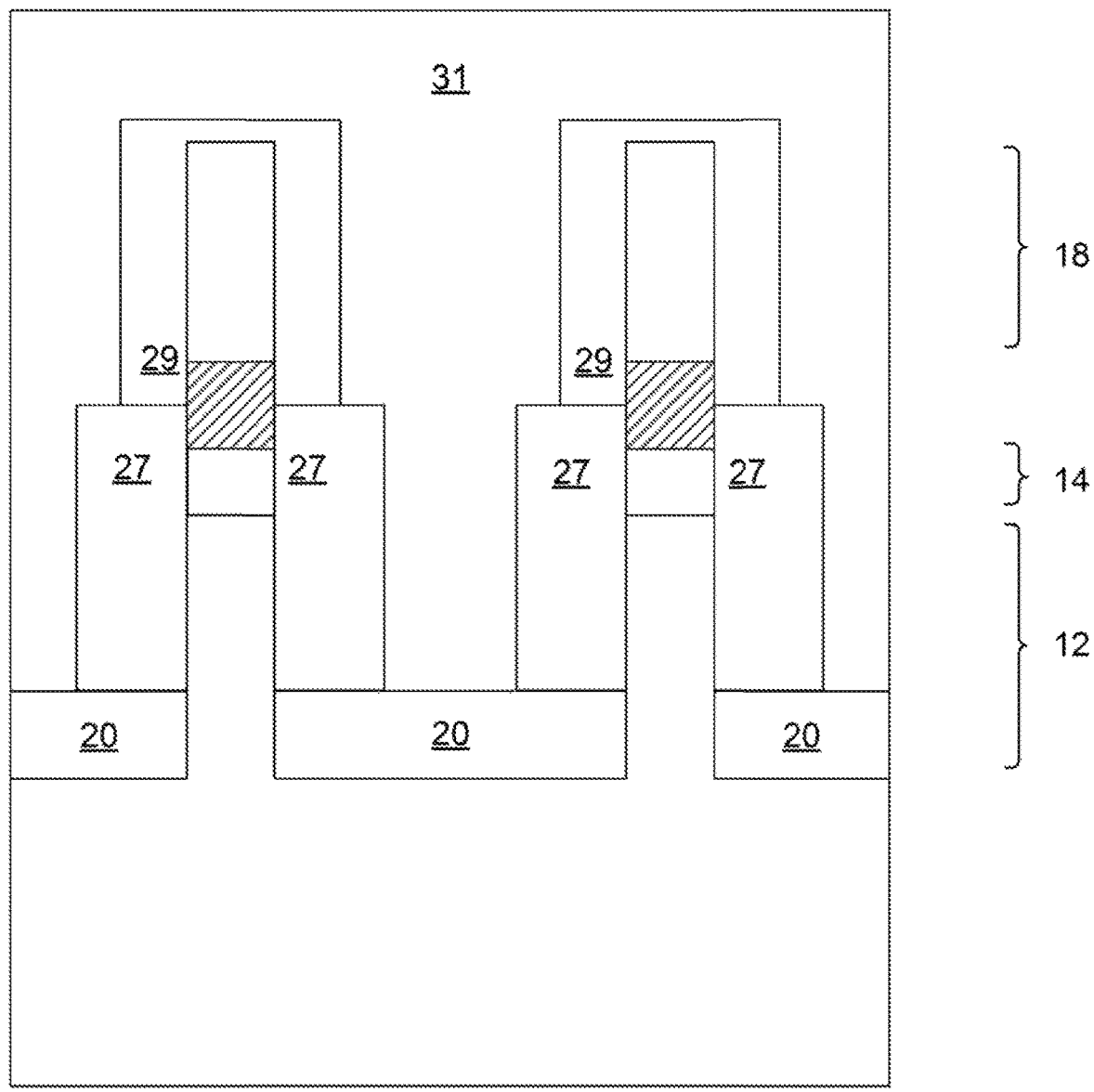

Referring now to FIGS. 15 and 16, the structure 100 is shown according to an exemplary embodiment. FIGS. 15 and 16 are each a cross-sectional view of the structure 100 along section lines A-A and C-C, respectively, illustrating a cross-sectional edge of two fin structures.

As shown in FIGS. 15 and 16, As shown in FIGS. 15 and 16, a lower source drain 27, an upper source drain 29, and an oxide cap 31 may be formed. As shown in FIG. 15, the lower source drain 27 and the upper source drain 29 are not formed in an area along the section A-A of the structure 100. The lower source drain 27 and the upper source drain 29 may be formed in an area along the section C-C of the structure 100. The lower source drain 27 and the upper source drain 29 may be formed as described above for the low SiGe layer 14, the high SiGe layer 16 and the upper silicon layer 18. The lower source drain 27 may server as a source drain for the lower FET of the stacked FET. The upper source drain 29 may serve as a source drain for the upper FET of the stacked FET. As shown in FIG. 16, the lower source drain 27 may be wider than the upper source drain, in order to allow for a future contact to each the lower source drain 27 and the upper source drain 29.

The oxide cap 31 may be formed as described for the spacer 20 and may be polished using a chemical mechanical polishing (CMP) technique until an upper surface of oxide cap 31 is at a height approximately 40-70 nm above an upper surface of the upper source drain 29 above the stacked FET, as measured above the upper surface of the substrate 10.

As further processing steps are performed on the structure 100, the section C-C may remain as shown in FIG. 16, until a finishing step when contacts are formed in the structure.

Figure 17:
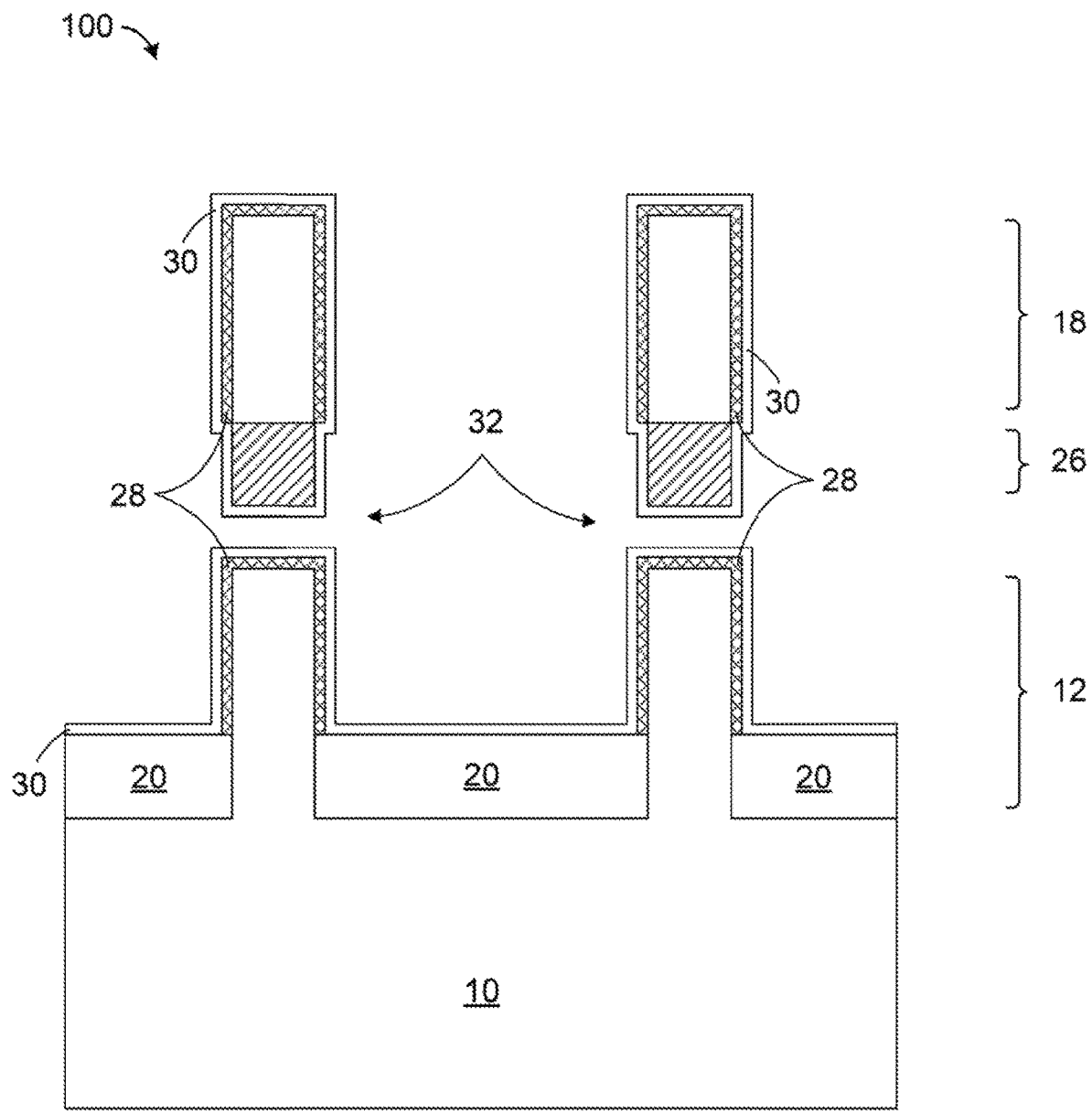
FIG. 17 illustrates a cross-sectional view of the semiconductor structure along section A-A and illustrates forming a liner, according to an exemplary embodiment.

Referring now to FIG. 17, the structure 100 is shown according to an exemplary embodiment. FIG. 17 is a cross-sectional view of the structure 100 along section line A-A, illustrating a cross-sectional edge of two fin structures.

As shown in FIG. 17, the oxide cap 31 may be removed, the low SiGe layer 14 may be selectively etched and removed from the structure 100, an interfacial (hereinafter "IL") liner 28 may be formed, and a high k liner 30 may be formed.

The oxide cap 31 and the low SiGe layer 14 may be selectively etched and removed via either a wet or dry etch process, as described above, with a selectively chemistry to remove the low SiGe layer 14. The upper silicon layer 18, the low k spacer 26, the silicon layer 12 and the spacer 20 may remain.

The structure 100 along section line C-C, as shown in FIG. 16, may provide support for the low k spacer 26 and the upper silicon layer 18 along section line A-A, as shown in FIG. 17.

The IL liner 28 may be conformally formed by a thermal/wet oxidation process followed by an atomic layer deposition (ALD). The IL liner 28 may include materials such as SiO2, GeO2, SiON, GeON The IL liner 28 may form on exposed areas of silicon, due to oxidation. The IL liner 28 may not form on a vertical side surface or horizontal lower surface of the low k spacer 26. The IL liner 28 may form on the horizontal upper surface and the vertical side surfaces of the silicon layer 12. The IL liner 28 may form on the horizontal upper surface and vertical side surfaces of the upper silicon layer 18. The IL liner 28 may be 1 nm thick. The IL liner 28 may have a vertical side surface coplanar with the vertical side surface of the upper silicon layer 18. The IL liner 28 may have a vertical side surface coplanar with the vertical side surface of the silicon layer 12. The IL liner 28 may have a horizontal upper surface coplanar with the horizontal upper surface of the upper silicon layer 18. The IL liner 28 may have a horizontal upper surface coplanar with the horizontal upper surface of the silicon layer 12. The IL liner 28 may have a horizontal lower surface coplanar with the horizontal upper surface of the IL liner 28. The IL liner 28 may provide interface passivation.

The high k liner 30 may be conformally formed on exposed surfaces of the IL liner 28 and on exposure surfaces of the low k spacer 26, and may be formed as described above in regards to the spacer 20. The high k liner 30 may include materials such as HfO2, ZrO2, Al2O3, La2O3. The high k liner 30 may form on the horizontal upper surface and exposed vertical side surfaces of the IL liner 28. The high k liner 30 may be formed on a horizontal lower surface and vertical side surface of the low k spacer 26. The high k liner 30 may be 2 nm thick. The high k liner 30 may have a vertical side surface coplanar with a vertical side surface of the IL liner 28. The IL liner 28 may have a horizontal upper surface coplanar with the horizontal upper surface of the silicon layer 12. The high k liner 30 may serve as the gate oxide for future gate formation.

A gap 32 may remain in the fin stack between the horizontal lower surface of the low k spacer 26 and a horizontal upper surface of the high k liner 30

Figure 18:
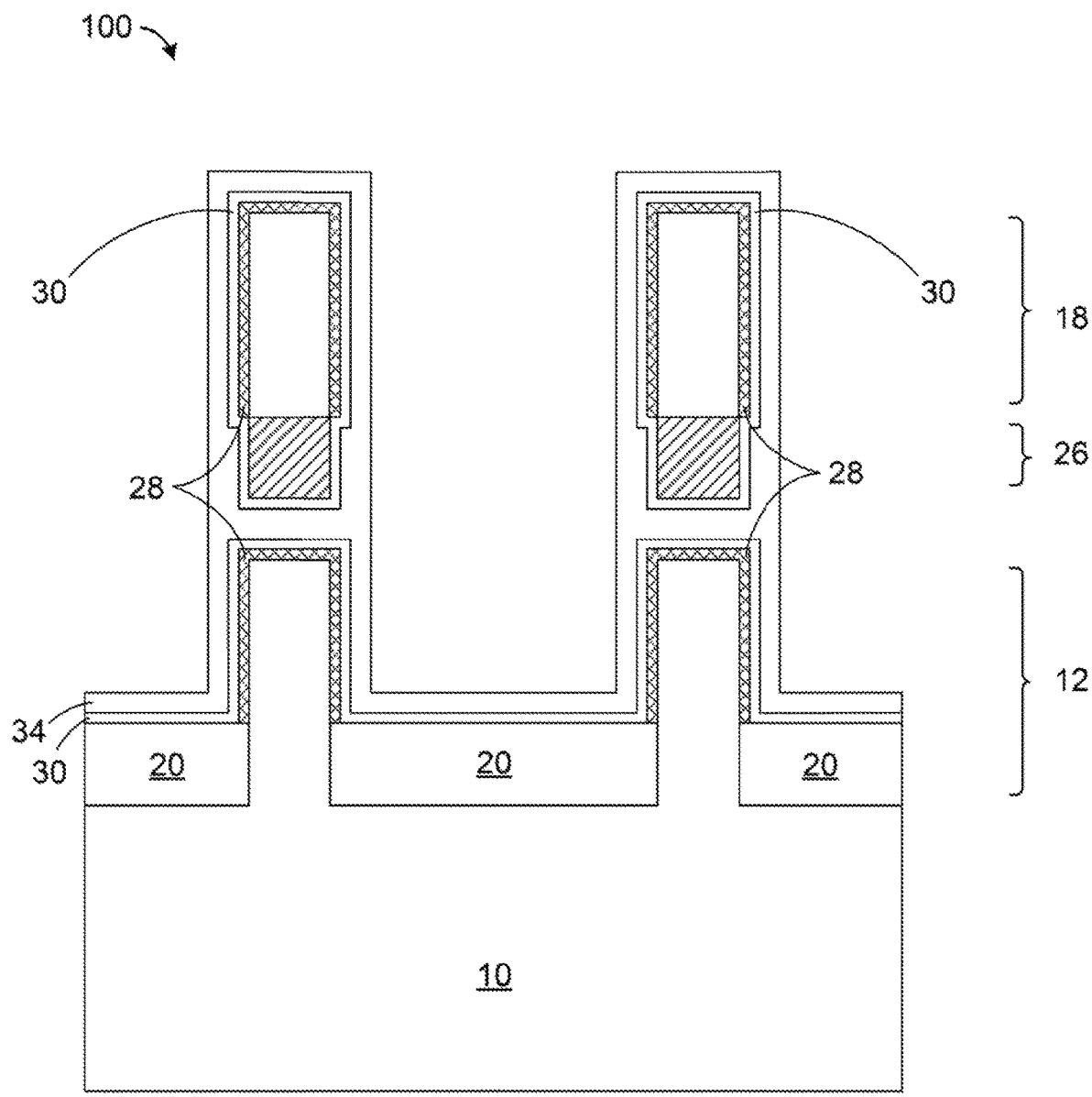
FIG. 18 illustrates a cross-sectional view of the semiconductor structure along section A-A and illustrates forming a work function metal layer, according to an exemplary embodiment.

Referring now to FIG. 18, the structure 100 is shown according to an exemplary embodiment. FIG. 18 is a cross-sectional view of the structure 100 along section line A-A, illustrating a cross-sectional edge of two fin structures.

As shown in FIG. 18, a PFET work function metal (hereinafter "WFM") 34 may be formed. The PFET WFM 34 may be conformally deposited on the structure 100, according to an exemplary embodiment. The PFET WFM 34 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the PFET WFM 34 may include one or more layers. In an embodiment, the PFET WFM 34 may include a work function metal including titanium nitride, tantalum nitride, titanium carbide or titanium aluminum carbide.

The PFET WFM 34 may be deposited on a top surface of the high k liner 30 and may fill the gap 32 between the low k spacer 26 and the high k liner 30 above the IL liner 28 which is above the silicon layer 12. A horizontal lower surface of the PFET WFM 34 may be coplanar with the horizontal upper surface of the high k liner 30. A vertical side surface of the PFET WFM 34 may be coplanar with a vertical side surface of the high k liner 30. A horizontal upper surface of the PFET WFM 34 may be coplanar with a horizontal lower surface of both the high k liner 30. Excess material of the PFET WFM 34 may be removed (using a conventional removal method, such as, for example, RIE) to leave the PFET WFM 34 only in the gap 32 and on sidewalls of the upper silicon layer 18 and sidewalls of the silicon layer 12. In an embodiment, the PFET WFM 34 for the lower fin of the double FET stack may be titanium carbide or titanium aluminum carbide for a PFET. The PFET WFM 34 may have a conformal thickness ranging from about 4 nm to about 6 nm, and ranges there between, although a thickness less than 4 nm and greater than 6 nm may be acceptable.

Figure 19:
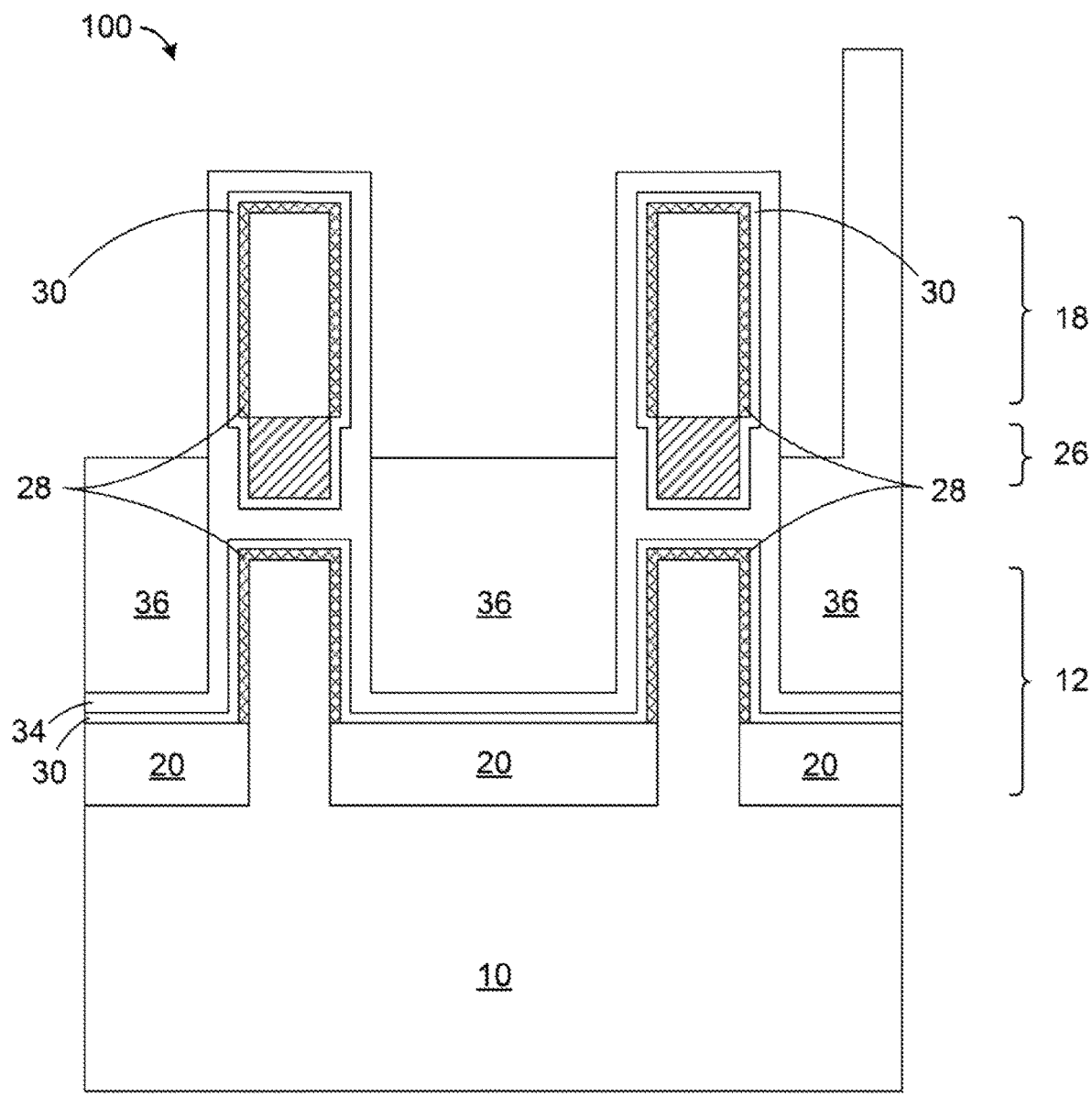
FIG. 19 illustrates a cross-sectional view of the semiconductor structure along section A-A and illustrates forming an interlayer dielectric, according to an exemplary embodiment.

Referring now to FIG. 19 the structure 100 is shown according to an exemplary embodiment. FIG. 19 is a cross-sectional view of the structure 100 along section line A-A, illustrating a cross-sectional edge of two fin structures.

As shown in FIG. 19, an interlayer dielectric (hereinafter "ILD") 36 may be formed, according to an exemplary embodiment. The ILD 36 may be formed directly on exposed top surfaces of the structure 100, according to an exemplary embodiment. The ILD 36 may be formed by conformally depositing or growing a dielectric material, followed by a combination of dry and wet anisotropic etch and recessing steps to remove portions of the dielectric material from a horizontal top surface of the PFET WFM 34 above the fin stack and from a portion of a vertical side surface of the PFET WFM 34 on the structure 100, such as sidewalls of the fin stack. After removal of portions of the ILD 36, the ILD 36 may remain on an exposed horizontal upper surface and exposed vertical surface of the PFET WFM 34, along a remaining portion of the fin stack and between adjacent fin stacks over the PFET WFM 34. A portion of a horizontal upper surface of the ILD 36 may have a greater height than the fin stack, as measured above a surface of the substrate 10. A remaining portion of the horizontal upper surface of the ILD 36 may have a greater height than a height the horizontal lower surface of low k spacer 26 and a lower height than a height of the horizontal upper surface of the low k spacer 26, as measured above a surface of the substrate 10.

The ILD 36 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the ILD 36 may include one or more layers. In an embodiment, the ILD 36 may include any dielectric material such as silicon oxide, silicon oxynitride, silicon nitride, SiBCN, SiOC, low-k dielectric or any combination of these materials. In an embodiment, the ILD 36 may be a nitride. In an alternate embodiment, the ILD 36 may be an oxide. In an embodiment, the ILD 36 may have a thickness ranging from about 60 nm to about 120 nm, and ranges there between, although a thickness less than 60 nm and greater than 120 nm may be acceptable.

Figure 20:
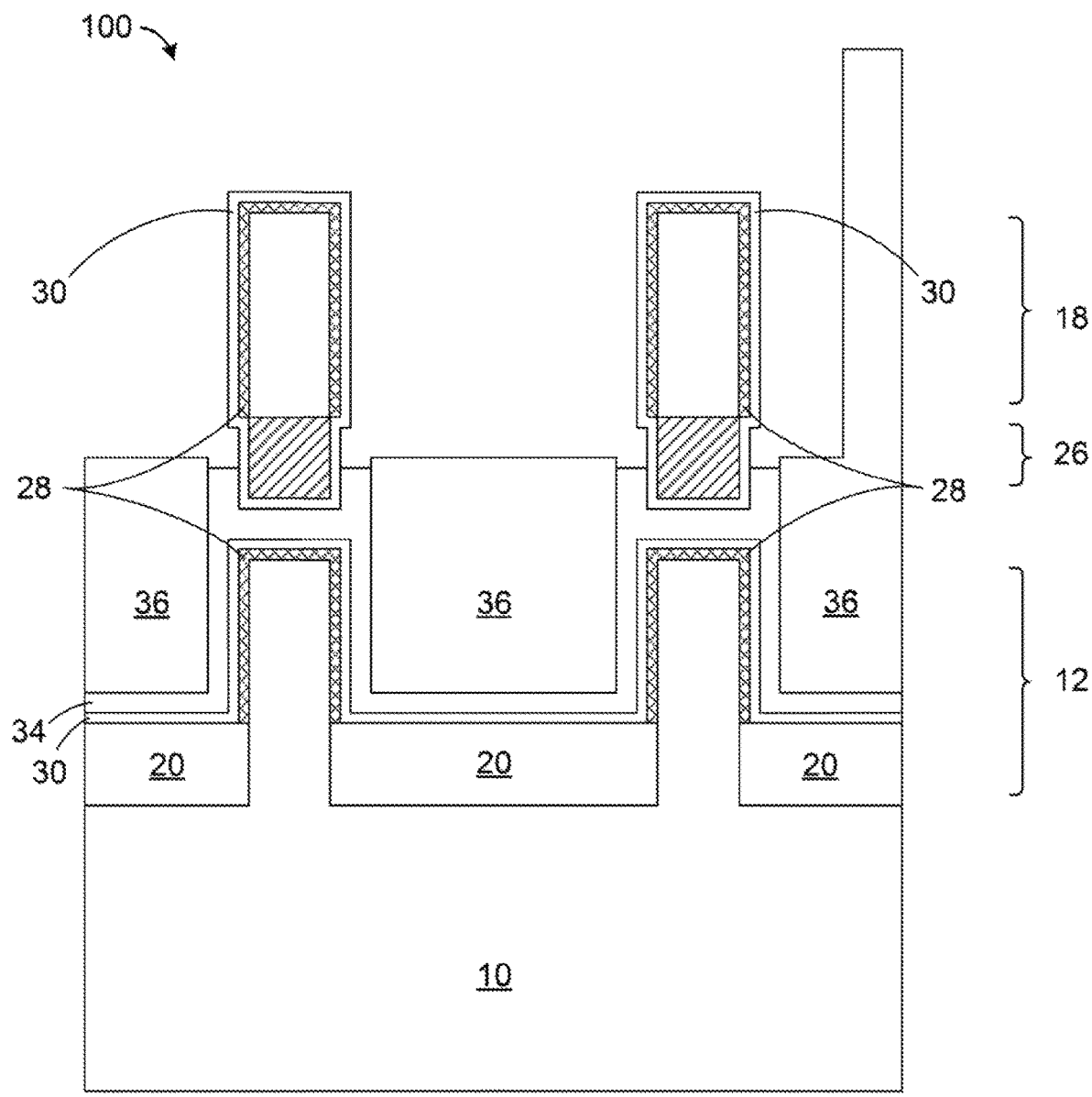
FIG. 20 illustrates a cross-sectional view of the semiconductor structure along section A-A and illustrates removing part of the work function metal layer, according to an exemplary embodiment.

Referring now to FIG. 20 the structure 100 is shown according to an exemplary embodiment. FIG. 20 is a cross-sectional view of the structure 100 along section line A-A, illustrating a cross-sectional edge of two fin structures.

As shown in FIG. 20, an exposed portion of the PFET WFM 34 is removed. The exposed portion of the PFET WFM 34 may be selectively removed using known techniques, using either a wet or dry etch process, with a selectively chemistry to remove the exposed portion of the PFET WFM 34 which is not covered by the ILD 36. The exposed portion of the PFET WFM 34 which is removed may include portions along the horizontal upper surface and the vertical side surface of the high k liner 30 surrounding the IL liner 28 which surrounds the upper silicon layer 18 of the upper fin of the fin stack. The PFET WFM 34 may be partially removed from the vertical side surface of the low k spacer 26. The horizontal upper surface of the PFET WFM 34 may be below the horizontal upper surface of the ILD 36 and above a horizontal lower surface of the ILD 36.

Figure 21:
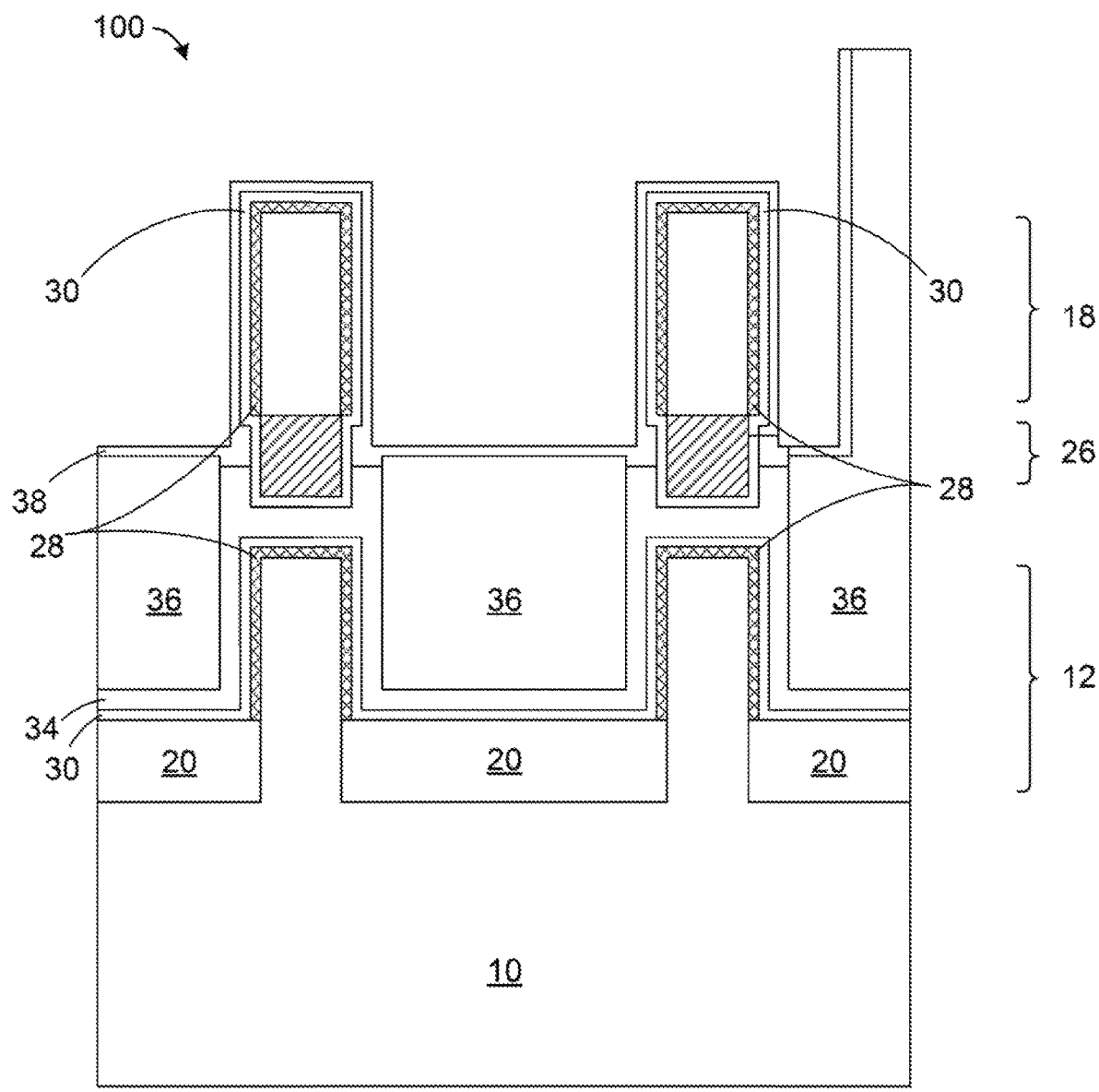
FIG. 21 illustrates a cross-sectional view of a semiconductor structure along section A-A and illustrates forming a dielectric layer, according to an exemplary embodiment.

Referring now to FIG. 21 the structure 100 is shown according to an exemplary embodiment. FIG. 21 is a cross-sectional view of the structure 100 along section line A-A, illustrating a cross-sectional edge of two fin structures.

As shown in FIG. 21, dielectric layer 38 may be formed. The dielectric layer 38 may be conformally deposited on exposed surfaces of the structure 100, according to an exemplary embodiment. The dielectric layer 38 may be formed on a horizontal upper surface and the vertical side surface of the ILD 36, on a horizontal upper surface on the vertical side surface of the high k liner 30, on a portion of the vertical side surface of the low k spacer 26 and on a portion of the horizontal upper surface of the PFET WFM 34. A horizontal upper of the dielectric layer 38 may be coplanar with a horizontal lower layer of the high k liner 30 and a horizontal lower layer of the IL liner 28

The dielectric layer 38 may be deposited using typical deposition techniques, for example, atomic layer deposition (ALD), molecular layer deposition (MLD), chemical vapor deposition (CVD), physical vapor deposition (PVD), and spin on techniques, followed by an anisotropic vertical etch process such as a reactive ion etch (RIE), or any suitable etch process. The material of the dielectric layer 38 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The dielectric layer 38 may further include dopants such as lanthanum and aluminum. In an embodiment, the dielectric layer 38 may include hafnium oxide. In an embodiment, the dielectric layer 38 may have a lateral thickness ranging from about 2 nm to about 5 nm and ranges there between, although a thickness less than 2 nm and greater than 5 nm may be acceptable. In some cases, the dielectric layer 38 may be referred to, and function as, a gate dielectric.

Figure 22:
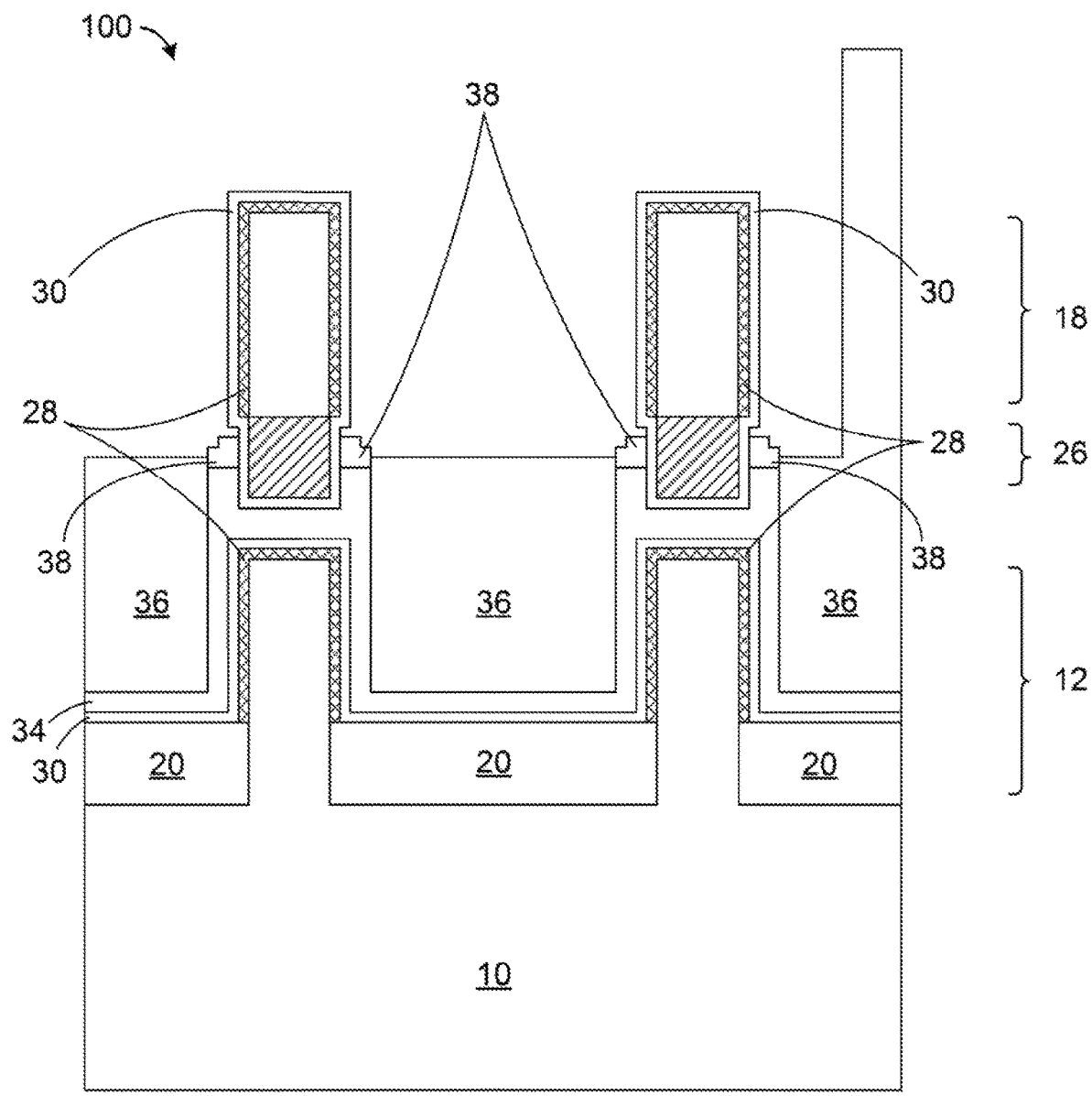
FIG. 22 illustrates a cross-sectional view of the semiconductor structure along section A-A and illustrates removing part of the dielectric layer, according to an exemplary embodiment.

Referring now to FIG. 22 the structure 100 is shown according to an exemplary embodiment. FIG. 22 is a cross-sectional view of the structure 100 along section line A-A, illustrating a cross-sectional edge of two fin structures.

As shown in FIG. 22, a portion of the dielectric layer 38 is may be selectively etched using selective wet or dry chemistry. The dielectric layer 38 may be removed from the vertical side surface of the ILD 36, from the horizontal upper surface of the ILD 36, from a portion of the vertical side surface of the low k spacer 26, from a horizontal upper surface, a vertical side surface, and a horizontal lower surface of the high k liner 30, and from the horizontal lower surface of the IL liner 28.

A horizontal lower surface of the dielectric layer 38 may be coplanar with the horizontal upper surface of the PFET WFM 34. The dielectric layer 38 may have a vertical side surface coplanar with a portion of the vertical side surface of the low k spacer 26. The dielectric layer 38 may have a portion of a vertical side surface coplanar with a portion of the vertical side surface of the ILD 36. The dielectric layer 38 may have a vertical thickness adjacent to the low k spacer 26 greater than a vertical thickness adjacent to the ILD 36, as measured from the horizontal upper surface of the substrate 10.

Figure 23:
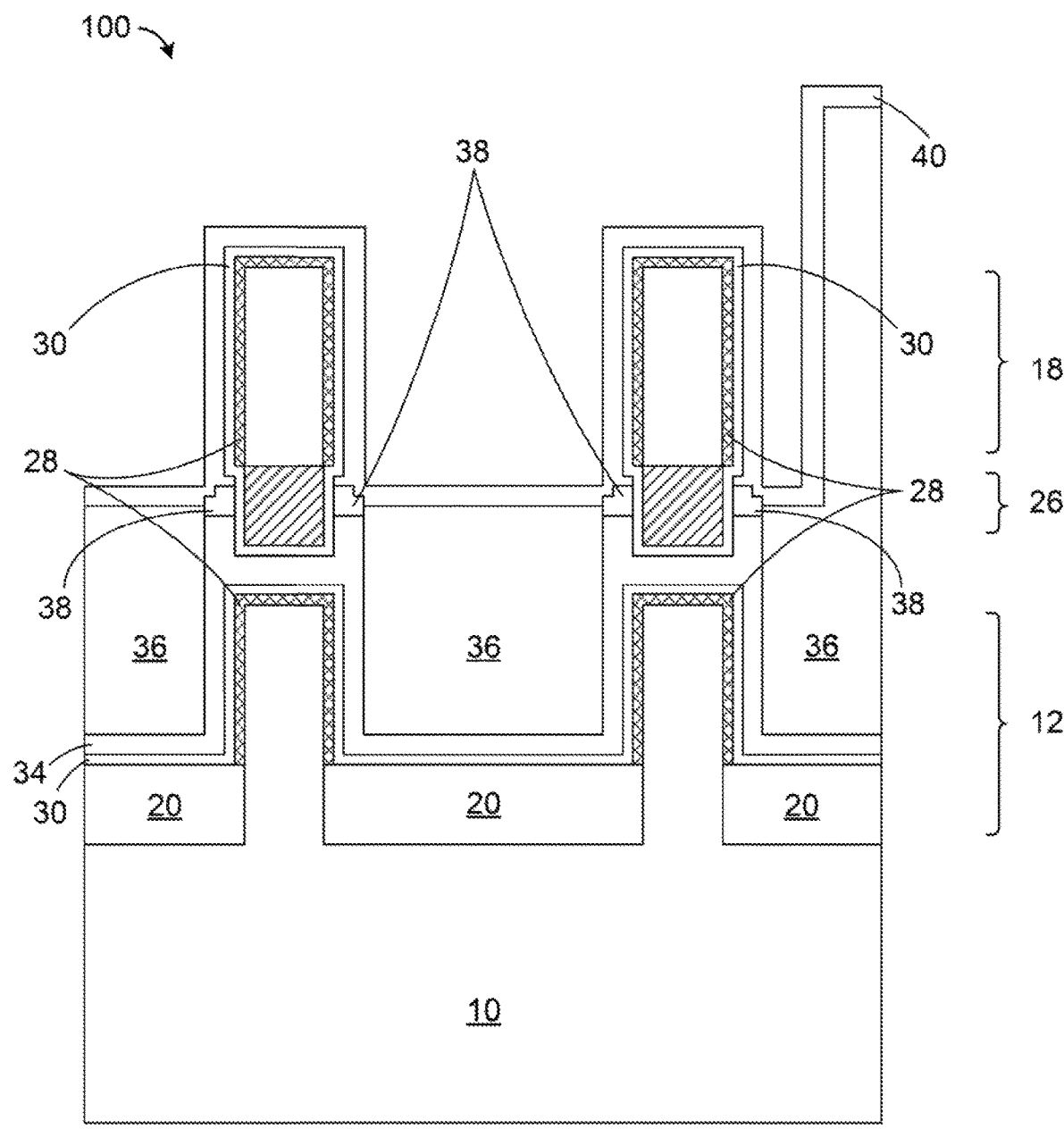
FIG. 23 illustrates a cross-sectional view of a semiconductor structure along section A-A and illustrates forming a second work function metal layer, according to an exemplary embodiment.

Referring now to FIG. 23 the structure 100 is shown according to an exemplary embodiment. FIG. 23 is a cross-sectional view of the structure 100 along section line A-A, illustrating a cross-sectional edge of two fin structures.

As shown in FIG. 23, an NFET work function metal (hereinafter "WFM") 40 may be formed. The NFET WFM 40 may be conformally deposited on the structure 100, according to an exemplary embodiment. The NFET WFM 40 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the NFET WFM 40 may include one or more layers. In an embodiment, the NFET WFM 40 may include a work function metal including titanium nitride, tantalum nitride, titanium carbide or titanium aluminum carbide. In an embodiment, the NFET WFM 40 may include a work function metal including titanium aluminum carbide and may include a different work function metal than the PFET WFM 34. In an embodiment, the NFET WFM 40 may have a conformal thickness ranging from about 4 nm to about 8 nm, and ranges there between, although a thickness less than 4 nm and greater than 8 nm may be acceptable. Excess material of the NFET WFM 40 may be removed (using a conventional removal method, such as, for example, RIE).

The NFET WFM 40 may be deposited on the horizontal upper surface of the high k liner 30, on a horizontal upper and the vertical side surface of the ILD 36, and on the dielectric layer 38. A horizontal lower surface of the NFET WFM 40 may be coplanar with the horizontal upper surface of the high k liner 30. The vertical side surface of the PFET WFM 34 may be coplanar with the horizontal upper surface and the vertical side surface of the high k liner 30. The horizontal lower surface of the NFET WFM 40 may be coplanar with the horizontal upper surface of the high k liner 30. A vertical side surface of the NFET WFM 40 may be coplanar with the vertical side surface of the high k liner 30. The horizontal upper surface of the PFET WFM 34 may be coplanar with the horizontal lower surface of both the high k liner 30 and the IL liner 28. A horizontal lower surface of the NFET WFM 40 may be coplanar with a horizontal upper surface of the dielectric layer 38. A portion of the vertical side surface of the NFET WFM 40 may be coplanar with a portion of a vertical side surface of the dielectric layer 38. A portion of the vertical side surface of the NFET WFM 40 may be coplanar with a portion of the vertical side surface of the low k spacer 26.

Figure 24:
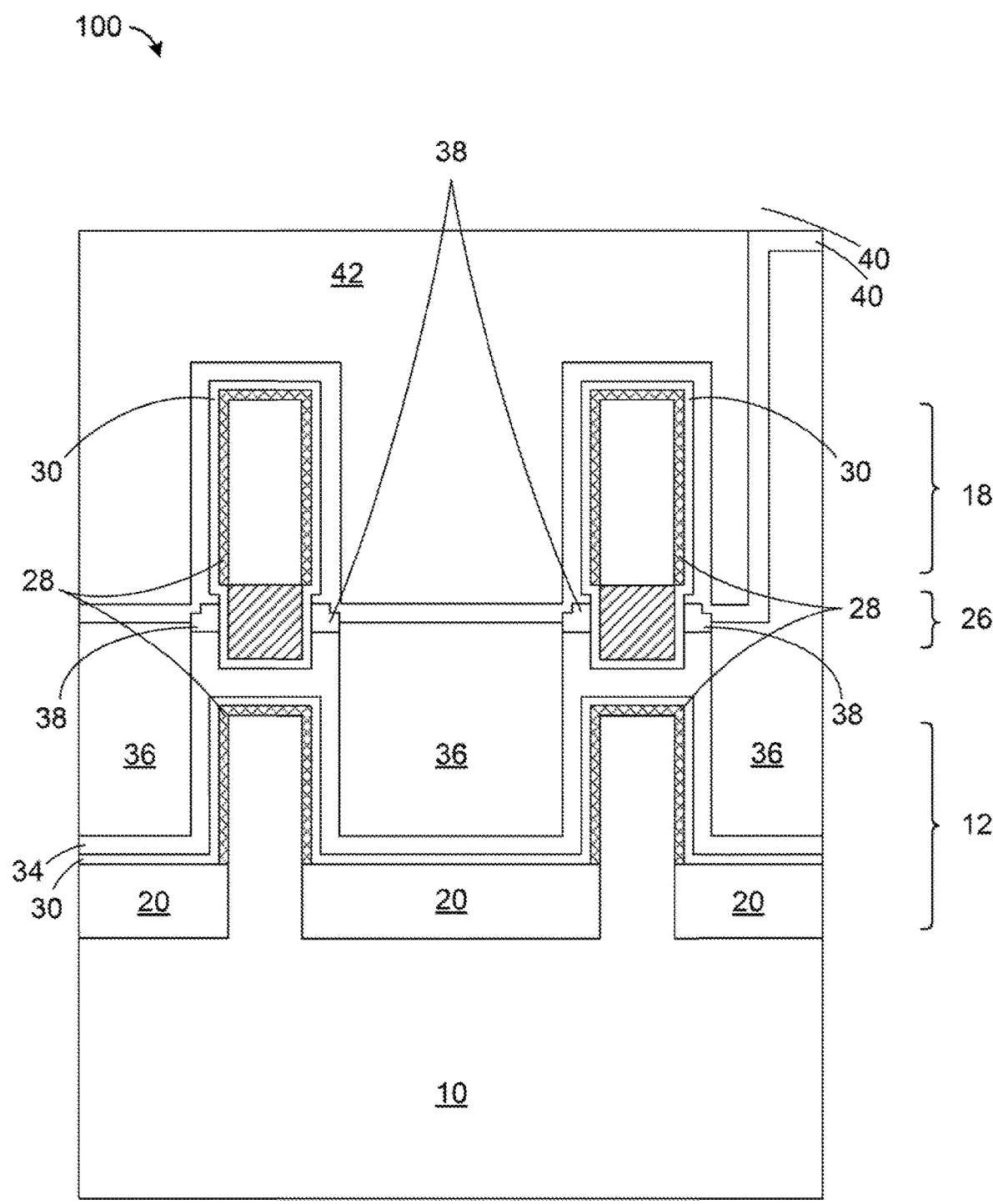
FIG. 24 illustrates a cross-sectional view of the semiconductor structure along section A-A and illustrates forming a metal fill, according to an exemplary embodiment.

Referring now to FIG. 24 the structure 100 is shown according to an exemplary embodiment. FIG. 24 is a cross-sectional view of the structure 100 along section line A-A, illustrating a cross-sectional edge of two fin structures.

As shown in FIG. 24, a metal fill 42 may be formed on the structure 100, and the metal fill 42 may be planarized. The metal fill 42 may be formed using conventional deposition techniques including, but not limited to: atomic layer deposition (ALD), chemical vapor deposition (CVD), molecular beam deposition (MBD), pulsed laser deposition (PLD), or liquid sourced misted chemical deposition (LSMCD). A height of an upper surface of the metal fill may be greater than a maximum height of the NFET WFM 40, as measured above the upper surface of the substrate 10. The metal fill 42 may be made from any known metal, e.g. Al, W, Cu, Zr, Ta, Hf, Ti, Ru, Pa, metal oxide, metal carbide, metal nitride, transition metal aluminides (e.g. Ti3Al, ZrAl), TaC, TiC, TaMgC, and any combination of those low resistively materials. The metal fill 42 may have one or more layers. In an embodiment, the metal fill 42 may have a bottom layer of Ti or TiN and a top layer of T or Cu. In an embodiment, the metal fill 42 may include tungsten.

Figure 25:
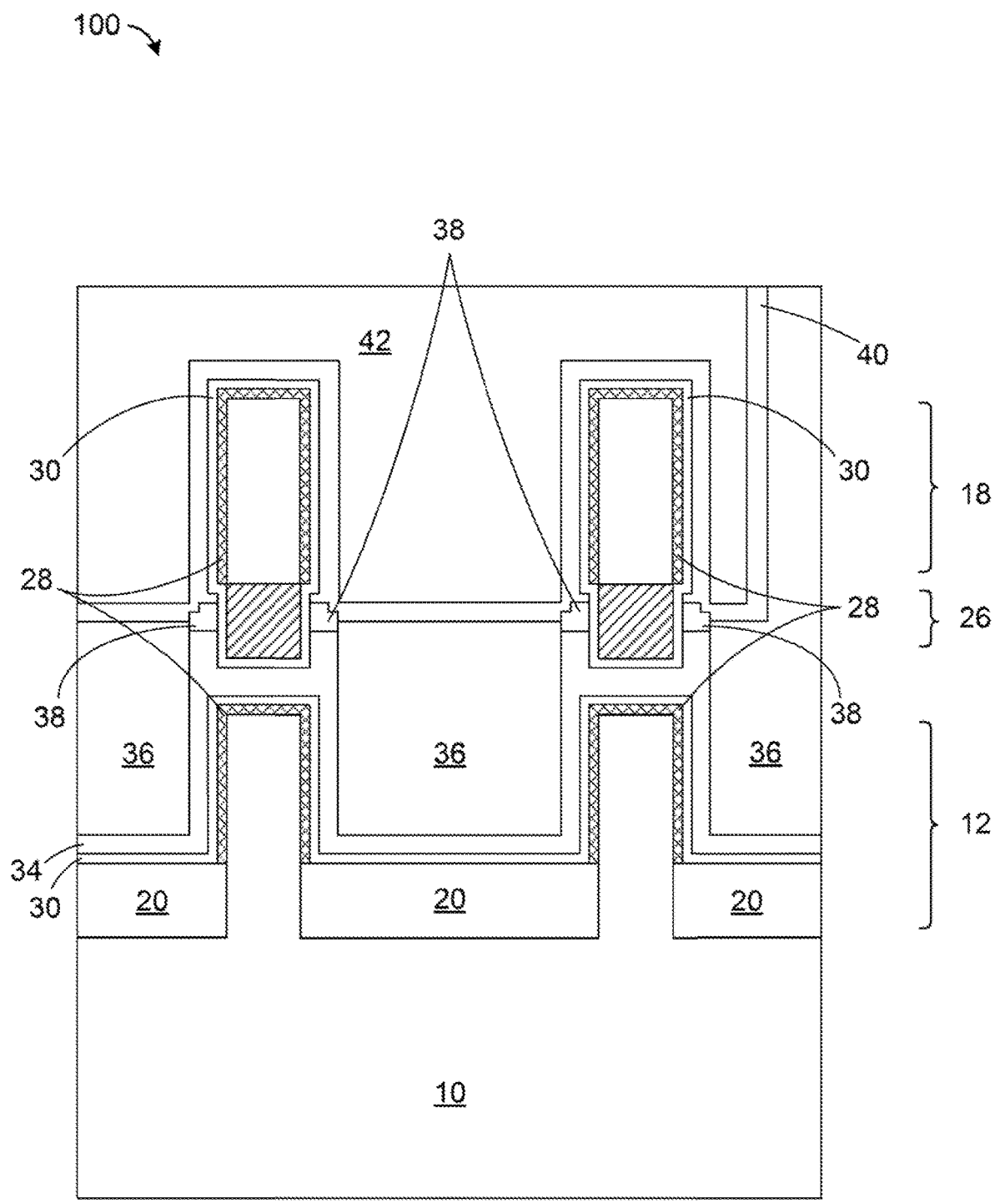
FIG. 25 illustrates a cross-sectional view of a semiconductor structure along section A-A and illustrates polishing according to an exemplary embodiment.

Referring now to FIG. 25 the structure 100 is shown according to an exemplary embodiment. FIG. 25 is a cross-sectional view of the structure 100 along section line A-A, illustrating a cross-sectional edge of two fin structures.

As shown in FIG. 25, the metal fill 42 may be polished using a chemical mechanical polishing (CMP) technique until an upper surface of metal fill 42 is at a height approximately 30-60 nm above an upper surface of the NFET WFM 40 above the gate stack, as measured above the upper surface of the substrate 10. An upper surface of the structure 100 may include an exposed upper surface of the metal fill 42 above the gate stack, and may include an exposed upper surface of the ILD 36 and an exposed upper surface of the NFET WFM 40.

Figure 26:
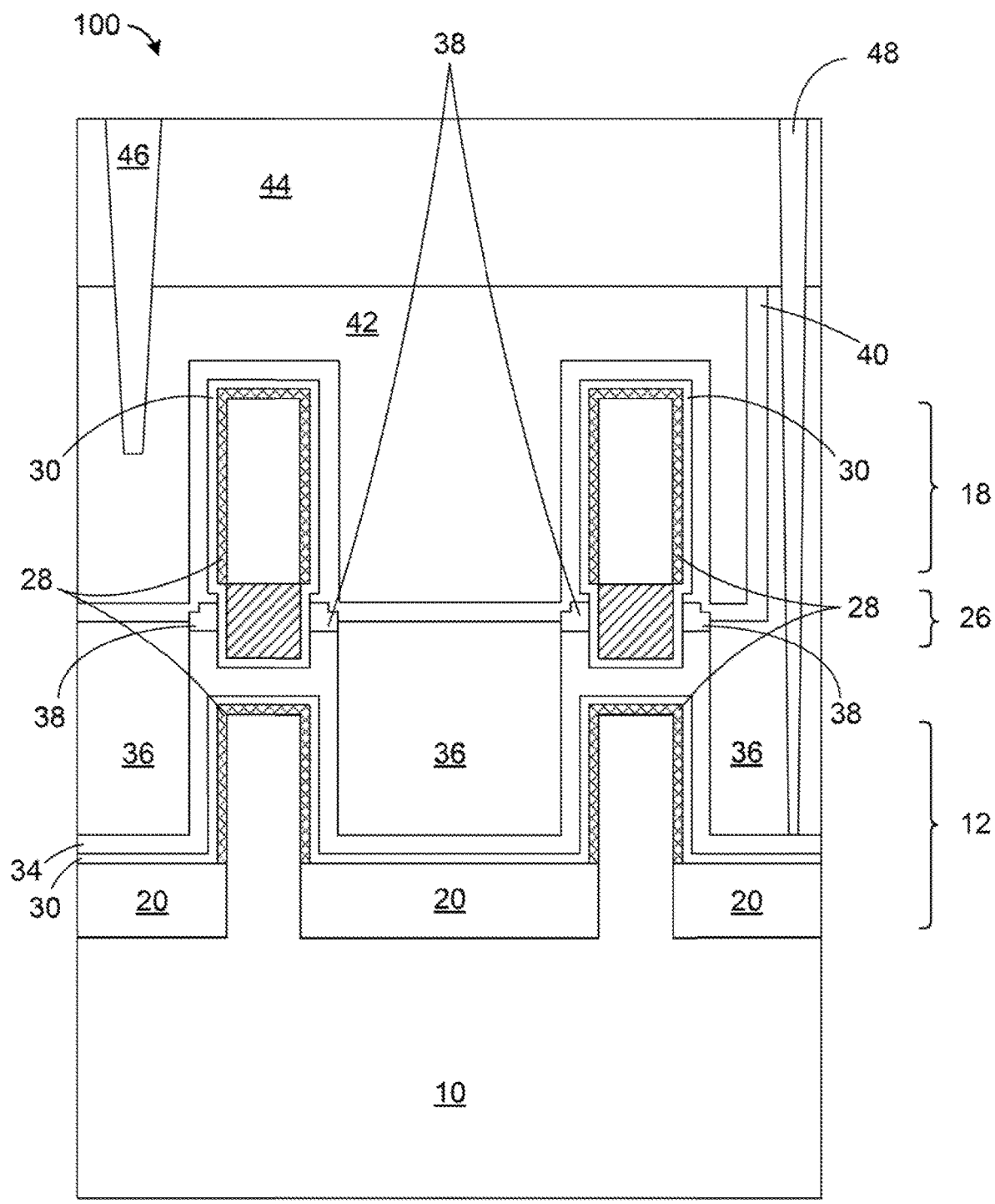
FIG. 26 illustrates a cross-sectional view of a semiconductor structure along section A-A and illustrates forming a contact, according to an exemplary embodiment.

Referring now to FIG. 26 the structure 100 is shown according to an exemplary embodiment. FIG. 26 is a cross-sectional view of the structure 100 along section line A-A, illustrating a cross-sectional edge of two fin structures.

As shown in FIG. 26, a dielectric 44 may be formed, an NFET contact 46 may be formed and a PFET contact 48 may be formed. The dielectric 44 may be formed and of a material as described above in relation to the spacer 20.

In forming the NFET contact 46 and the PFET contact 48, an opening for each may be formed (not shown) and each opening filled using conventional deposition techniques including, but not limited to: atomic layer deposition (ALD), chemical vapor deposition (CVD), molecular beam deposition (MBD), pulsed laser deposition (PLD), or liquid sourced misted chemical deposition (LSMCD). The NFET contact 46 and the PFET contact 48, may then be may be polished using a chemical mechanical polishing (CMP) technique until a top surface of the NFET contact 46 and the PFET contact 48 is substantially coplanar with a top surface of the dielectric 44. The NFET contact 46 and the PFET contact 48 may be made from any known metal, e.g. Al, W, Cu, Zr, Ta, Hf, Ti, Ru, Pa, metal oxide, metal carbide, metal nitride, transition metal aluminides (e.g. Ti3Al, ZrAl), TaC, TiC, TaMgC, and any combination of those materials. The NFET contact 46 and the PFET contact 48 may have one or more layers. In an embodiment, the NFET contact 46 and the PFET contact 48 may have a bottom layer of Ti or TiN and a top layer of T or Cu.

The NFET contact 46 may be bordered on the bottom by the metal fill 42. The NFET contact 46 may be bordered on a vertical side surface by the metal fill 42 and by the dielectric 44. The NFET contact 46 may provide an electrical connection to the NFET WFM 40 through the metal fill 42, providing a contact to a gate of the upper FET of the finFET stack.

The PFET contact 48 may be bordered on the bottom by the PFET WFM 34. The PFET contact 48 may be bordered on a vertical side surface by the metal fill 42, the dielectric 44. The NFET contact 46 may provide an electrical connection to the NFET WFM 40 through the metal fill 42, providing a contact to a gate of the upper FET of the finFET stack.

The structure 100 provides a separate gate contact for the upper FET, PFET contact 46, and for the lower FET, NFET contact 48, of the double stacked finFETs. The dielectric layer 38 provides an isolation between the PFET WFM 34 and the NFET WFM 40, thus allowing formation of separate contacts for each of the FETs in the fin stack.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    an upper fin of a double stacked fin separated from a lower fin of the double stacked fin by a low k spacer and by a p type field effect transistor work function metal layer, wherein a horizontal lower surface of the upper fin is coplanar with a horizontal upper surface of the low k spacer and a horizontal lower surface of the low k spacer is coplanar with a first horizontal upper surface of the p type field effect transistor work function metal layer, and
    an inner level dielectric layer, wherein a horizontal lower surface of the inner level dielectric layer is coplanar with a portion of an upper surface of the p type field effect transistor work function metal layer, a vertical side surface of the inner level dielectric layer is coplanar with a vertical side surface of the p-type field effect transistor work function metal layer, and a horizontal upper surface of the inner level dielectric layer is coplanar with a horizontal lower surface of an n type field effect transistor work function metal layer.

2. The semiconductor structure according to claim 1, further comprising:
    a dielectric layer, wherein a horizontal lower surface of the dielectric layer is coplanar with a second horizontal upper surface of the p type field effect transistor work function metal layer, and a vertical side surface of the dielectric layer is coplanar with a vertical side surface of the low k spacer.

3. The semiconductor structure according to claim 2, further comprising:
    the n type field effect transistor work function metal layer, wherein a lower surface of the n type field effect transistor work function metal layer is coplanar with an upper surface of the dielectric layer, and a vertical side surface of the n type field effect transistor work function metal layer is coplanar with a portion of the vertical side surface of the low k spacer.

4. The semiconductor structure according to claim 1, wherein the p type field effect transistor work function metal layer surrounds the upper fin of the double stacked fin, and the n type field effect transistor work function metal layer surrounds the lower fin of the double stacked fin.

5. The semiconductor structure according to claim 1, wherein
    a dielectric layer, wherein a horizontal lower surface of the dielectric layer is coplanar with a second horizontal upper surface of the p type field effect transistor work function metal layer, and a vertical side surface of the dielectric layer is coplanar with a vertical side surface of the low k spacer; and
    a portion of the vertical side surface of the inner level dielectric is coplanar with a portion of the vertical side surface of the dielectric layer.

6. The semiconductor structure according to claim 1, further comprising:
    a p-type field effect transistor work function metal layer contact; and
    a n-type field effect transistor work function metal layer contact.

* * * * *